United States Patent
Park

(10) Patent No.: US 8,471,300 B2
(45) Date of Patent: Jun. 25, 2013

(54) IMAGE SENSOR DEVICES INCLUDING ELECTRICALLY CONDUCTIVE REFLECTORS

(75) Inventor: Byung-Jun Park, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 38 days.

(21) Appl. No.: 13/416,624

(22) Filed: Mar. 9, 2012

(65) Prior Publication Data

US 2012/0175720 A1 Jul. 12, 2012

Related U.S. Application Data

(63) Continuation of application No. 12/580,393, filed on Oct. 16, 2009, now Pat. No. 8,154,062.

(30) Foreign Application Priority Data

Dec. 17, 2008 (KR) .......................... 10-2008-0128691

(51) Int. Cl.
*H01L 27/148* (2006.01)
*H01L 31/0232* (2006.01)

(52) U.S. Cl.
USPC ........... 257/228; 257/231; 257/292; 257/432; 257/436; 257/E31.119

(58) Field of Classification Search
USPC ................. 257/228, 231, 291, 292, 432, 436, 257/447, E31.119
See application file for complete search history.

(56) References Cited

U.S. PATENT DOCUMENTS

| | | | |
|---|---|---|---|
| 8,043,883 B2 | 10/2011 | Sakoh et al. | |
| 8,154,062 B2* | 4/2012 | Park | 257/291 |
| 2007/0001100 A1 | 1/2007 | Hsu et al. | |
| 2009/0014824 A1* | 1/2009 | Sakoh et al. | 257/432 |
| 2009/0140365 A1* | 6/2009 | Lee et al. | 257/460 |
| 2009/0184387 A1 | 7/2009 | Takeuchi | |
| 2009/0197365 A1* | 8/2009 | Kim et al. | 438/70 |
| 2009/0200631 A1 | 8/2009 | Tai et al. | |
| 2010/0006969 A1 | 1/2010 | Park et al. | |
| 2010/0032785 A1* | 2/2010 | Maruyama et al. | 257/443 |
| 2010/0072568 A1* | 3/2010 | Park | 257/432 |
| 2010/0187648 A1 | 7/2010 | Hashimoto | |
| 2010/0237451 A1 | 9/2010 | Murakoshi | |
| 2010/0308386 A1 | 12/2010 | Abe et al. | |
| 2011/0018079 A1 | 1/2011 | Pain | |
| 2011/0201144 A1 | 8/2011 | Toda | |
| 2011/0250716 A1 | 10/2011 | Kohyama | |
| 2011/0266598 A1 | 11/2011 | Mabuchi | |
| 2011/0269259 A1 | 11/2011 | Tatani et al. | |
| 2012/0267691 A1* | 10/2012 | Suzuki et al. | 257/225 |

* cited by examiner

*Primary Examiner* — Ngan Ngo
(74) *Attorney, Agent, or Firm* — Myers Bigel Sibley & Sajovec, P.A.

(57) ABSTRACT

An image sensor device includes a substrate including a light sensing region therein and a reflective structure on a first surface of the substrate over the light sensing region. An interconnection structure having a lower reflectivity than the reflective structure is provided on the first surface of the substrate adjacent to the reflective structure. A microlens is provided on a second surface of the substrate opposite the first surface. The microlens is configured to direct incident light to the light sensing region, and the reflective structure is configured to reflect portions of the incident light that pass through the light sensing region back toward the light sensing region. Related devices and fabrication methods are also discussed.

23 Claims, 22 Drawing Sheets ively long wavelengths may pass through photodiodes having relatively shallow depths. For example, for photodiodes having a depth of about 5 μm or less, electrons provided by longer wavelength light may not accumulate into the potential wells of the photodiodes. As a result, the quantum efficiency of the CIS may be deteriorated.
IMAGE SENSOR DEVICES INCLUDING ELECTRICALLY CONDUCTIVE REFLECTORS

CROSS-REFERENCE TO RELATED APPLICATION

This application claims priority from and is a continuation of U.S. patent application Ser. No. 12/580,393, filed Oct. 16, 2009 now U.S. Pat. No. 8,154,062 which claims priority under 35 U.S.C. §119 from Korean Patent Application No. 10-2008-0128691 filed on Dec. 17, 2008, the disclosures of which are hereby incorporated by reference herein in their entireties.

BACKGROUND

The present inventive concept relates to integrated circuit devices, and more particularly, to image sensors and related fabrication methods.

A CMOS image sensor (CIS) may be used to convert an optical image signal into an electrical signal. A CIS may provide a lower operational voltage and/or reduced power consumption as compared to a charge-coupled device (CCD) image sensor. A CIS may also allow for higher integration, and thus, may be widely used in many fields.

A CIS may include a photodiode formed in a substrate. The photodiode may be configured to accumulate electrons in response to incident light. The CIS may further include an intermediate layer having metal interconnection patterns therein on the substrate, as well as a microlens and a color filter on the intermediate layer. Light may enter the microlens and/or the color filter on the "front side" of the substrate, and may pass through the intermediate layer to the photodiode. Such image sensors are referred to herein as "front-side illuminated" sensors. The metal interconnection patterns are configured to output an electrical signal based on the light incident on the photodiode. However, the incident light may be reflected by the metal interconnection patterns and/or may be absorbed by the intermediate layer, which may adversely affect the sensitivity of the CIS. In particular, when incident light is absorbed by the intermediate layer, the light sensitivity and/or the quantum efficiency of the CIS may be reduced. Also, when light is reflected by the metal interconnection patterns, the reflected light may be received by an adjacent photodiode, which may result in crosstalk problems.

Accordingly, image sensors have been developed where the micro lens and/or color filter are provided on the "back side" or bottom of the substrate, and incident light enters the backside of the substrate. Such image sensors are referred to herein as "backside illuminated" sensors (BIS). In a backside illuminated CMOS image sensor, the substrate including the photodiodes therein and the intermediate layer including the metal interconnection patterns therein may be bonded or otherwise attached to a supporting wafer, such that the substrate including the photodiodes may be opposite the supporting wafer. The entire structure may be turned upside-down (or "flipped"), and the substrate including the photodiodes may be thinned. The color filter and the microlens may thereby be provided on the bottom or backside surface of the substrate opposite the supporting wafer, such that the photodiodes are adjacent to the color filter and the microlens. However, as photon flux may be dependent upon both the wavelength of the incident light and the depth of the photodiode, light having relatively long wavelengths may pass through photodiodes having relatively shallow depths. For example, for photodiodes having a depth of about 5 μm or less, electrons

SUMMARY

According to some embodiments of the present inventive concept, an image sensor device includes a substrate including a light sensing region therein, a reflective structure on a first surface of the substrate over the light sensing region, and an interconnection structure having a lower reflectivity than the reflective structure on the first surface of the substrate adjacent to the reflective structure. A microlens is provided on a second surface of the substrate opposite the first surface. The microlens is configured to direct incident light to the light sensing region, and the reflective structure is configured to reflect portions of the incident light that pass through the light sensing region back toward the light sensing region.

In some embodiments, the reflective structure may be a conductive layer. The interconnection structure may also include the conductive layer, as well as an adhesive layer between the conductive layer and the substrate. The adhesive layer may reduce a reflectivity of the interconnection structure relative to that of the reflective structure. For example, the conductive layer may be aluminum, and the adhesive layer may be titanium.

In some embodiments, the reflective structure may be aligned with the light sensing region in plan view such that the portions of the incident light that pass through the light sensing region are incident on the reflective structure. The reflective structure may be concave or convex in cross section.

In some embodiments, the reflective structure may be a first reflective structure. The image sensor device may further include an interlayer dielectric layer on the first reflective structure, and a second reflective structure on the interlayer dielectric layer over the light sensing region and laterally offset from the first reflective structure. The second reflective structure may be configured to reflect portions of the incident light that pass through the light sensing region and are not reflected by the first reflective structure back towards the light sensing region.

In some embodiments, the image sensor device may further include an interlayer dielectric layer on the first surface of the substrate between the reflective structure and the light sensing region. The interlayer dielectric layer may include at least one gate structure therein electrically connected to the interconnection structure. The at least one gate structure may not obstruct passage of the portions of the incident light that pass through the light sensing region to the reflective structure.

In some embodiments, the interlayer dielectric layer may include a recess therein adjacent to the reflective structure and aligned with the at least one gate structure therein. The interconnection structure including the adhesive layer may extend into the recess. For example, portions of the adhesive layer may extend on sidewalls of the recess and may be configured to reflect the portions of the incident light back toward the light sensing region. Also, the interlayer dielectric layer may include a second recess therein adjacent to the interconnection structure and aligned with the light sensing region in the substrate. The reflective structure may extend into the second recess.

In some embodiments, the light sensing region may have a thickness of about 5 μm or less, and the portions of the incident light that pass through the light sensing region may have wavelengths of greater than about 500 nm.

According to further embodiments of the present inventive concept, a computer apparatus includes a processor, an input/output element, a memory element, an image sensor, and a bus configured to communicatively couple the processor, the input/output element, the memory element, and the image sensor. The image sensor includes a substrate including a light sensing region therein, a reflective structure on a first surface of the substrate over the light sensing region, and an interconnection structure having a lower reflectivity than the reflective structure on the first surface of the substrate adjacent to the reflective structure. A microlens is provided on a second surface of the substrate opposite the first surface. The microlens is configured to direct incident light to the light sensing region, and the reflective structure is configured to reflect portions of the incident light that pass through the light sensing region back toward the light sensing region.

According to still further embodiments of the present inventive concept, an electronic system includes a row decoder, a column decoder, a timing generator configured to provide timing and control signals to the row decoder and the column decoder, a row driver configured to generate a driving signal, and a sensor array configured to provide an output signal in response to the driving signal from the row driver. The sensor array includes at least one image sensor device. The image sensor device includes a substrate including a light sensing region therein, a reflective structure on a first surface of the substrate over the light sensing region, and an interconnection structure having a lower reflectivity than the reflective structure on the first surface of the substrate adjacent to the reflective structure. A microlens is provided on a second surface of the substrate opposite the first surface. The microlens is configured to direct incident light to the light sensing region, and the reflective structure is configured to reflect portions of the incident light that pass through the light sensing region back toward the light sensing region.

According to yet further embodiments of the present inventive concept, a camera apparatus includes a substrate, an image sensor chip on the substrate and connected thereto by at least one of a bonding wire and a conductive via structure extending through the image sensor chip, an aperture configured to receive incident light, and at least one lens configured to direct the incident light toward the image sensor chip. The image sensor chip includes at least one image sensor device. The image sensor device includes a substrate including a light sensing region therein, a reflective structure on a first surface of the substrate over the light sensing region, and an interconnection structure having a lower reflectivity than the reflective structure on the first surface of the substrate adjacent to the reflective structure. A microlens is provided on a second surface of the substrate opposite the first surface. The microlens is configured to direct incident light to the light sensing region, and the reflective structure is configured to reflect portions of the incident light that pass through the light sensing region back toward the light sensing region.

According to some embodiments of the present inventive concept, a method of fabricating an image sensor device includes forming a reflective structure on a first surface of a substrate over a light sensing region therein. An interconnection structure having a lower reflectivity than the reflective structure is formed on the first surface of the substrate adjacent to the reflective structure, and a microlens is provided on a second surface of the substrate opposite the first surface. The microlens is configured to focus incident light on the light sensing region, and the reflective structure is configured to reflect portions of the incident light that pass through the light sensing region back toward the light sensing region.

In some embodiments, forming the reflective structure and forming the interconnection structure may include forming an adhesive layer pattern on the first surface of the substrate. The adhesive layer pattern may expose a portion of the first surface of the substrate over the light sensing region therein. A conductive layer may be formed on the first surface of the substrate and on the adhesive layer pattern. The conductive layer may be patterned to define the reflective structure including the conductive layer on the first surface of the substrate over the light sensing region, and to define the interconnection structure including the conductive layer and the adhesive layer pattern between the conductive layer and the substrate. The adhesive layer pattern may reduce a reflectivity of the interconnection structure relative to that of the reflective structure. For example, the conductive layer may be aluminum, and the adhesive layer pattern may be titanium.

In some embodiments, the reflective structure may be formed aligned with the light sensing region in plan view such that the portions of the incident light that pass through the light sensing region are incident on the reflective structure.

In some embodiments, prior to forming the reflective structure and forming the interconnection structure, an interlayer dielectric layer may be formed on the first surface of the substrate. The interlayer dielectric layer may be patterned to define one of a concave or convex portion therein over the light sensing region and aligned therewith. The reflective structure may be formed on the concave or convex portion of the patterned interlayer dielectric layer such that the reflective structure is convex or concave in cross section, respectively.

In some embodiments, the reflective structure may be a first reflective structure, and an interlayer dielectric layer may be formed on the first reflective structure. A second reflective structure may be formed on the interlayer dielectric layer over the light sensing region and laterally offset from the first reflective structure. The second reflective structure may be configured to reflect portions of the incident light that pass through the light sensing region and are not reflected by the first reflective structure back towards the light sensing region.

In some embodiments, prior to forming the reflective structure and forming the interconnection structure, at least one gate structure may be formed on the first surface of the substrate, and an interlayer dielectric layer may be formed on the at least one gate structure. The at least one gate structure may not be aligned with the light sensing region therein.

In some embodiments, a recess may be formed in the interlayer dielectric layer aligned with the at least one gate structure. The interconnection structure may be formed on the interlayer dielectric layer such that the interconnection structure extends into the recess.

In some embodiments, forming the adhesive layer pattern may include conformally forming an adhesive layer on a surface of the interlayer dielectric layer such that portions of the adhesive layer extend into the recess in the interlayer dielectric layer and on sidewalls thereof, and patterning the adhesive layer to expose the surface of the interlayer dielectric layer such that the portions of the adhesive layer in the recess remain to define the adhesive layer pattern. Portions of the adhesive layer pattern on the sidewalls of the recess may be configured to reflect the portions of the incident light back toward the light sensing region.

In some embodiments, the recess in the dielectric layer may be a first recess, and a second recess may be formed in the interlayer dielectric layer aligned with the light sensing region in the substrate. The reflective structure may be formed on the interlayer dielectric layer such that the reflective structure extends into the second recess.

In some embodiments, prior to forming the reflective structure and forming the interconnection structure, the light sensing region may be formed in the substrate, and portions of the substrate may be removed. The portions of the incident light that pass through the light sensing region may have wavelengths of greater than about 500 nm.

Other elements and/or devices according to some embodiments will become apparent to one with skill in the art upon review of the following drawings and detailed description. It is intended that all such additional devices, in addition to any combination of the above embodiments, be included within this description, be within the scope of the inventive concept, and be protected by the accompanying claims.

DETAILED DESCRIPTION OF EMBODIMENTS

Figure 1:
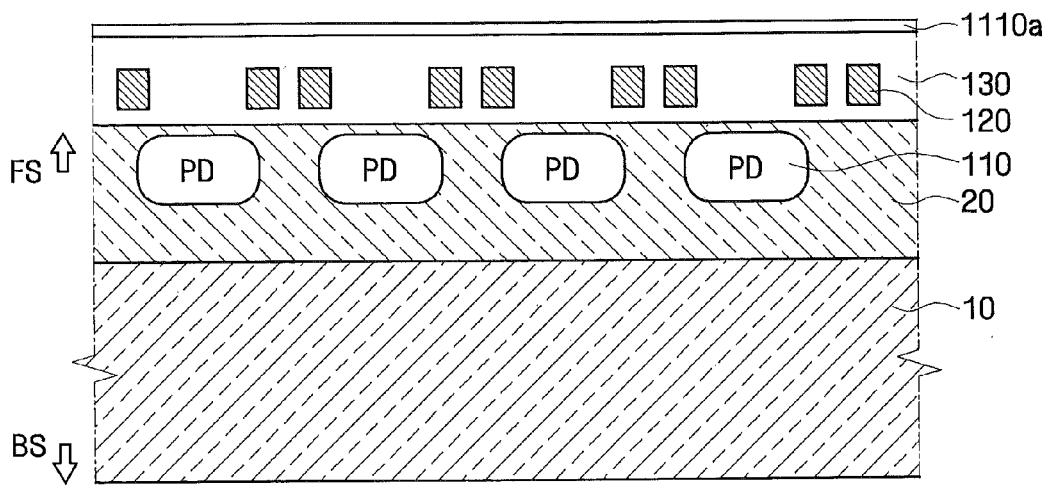
FIGS. 1 to 9 are cross-sectional views illustrating CMOS image sensor devices and fabrication methods according to some embodiments of the present inventive concept.

The present inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "under", "above", "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Likewise, when light is received or provided "from" one element, it can be received or provided directly from that element or from an intervening element. On the other hand, when light is received or provided "directly from" one element, there are no intervening elements present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

Embodiments of the present inventive concept are described herein with reference to image sensor devices including a light sensing device, such as a photodiode, in a substrate having a first surface and a second surface opposite to the first surface. A reflective structure is provided on the first surface over the light sensing device. The reflective structure may include a conductive layer. An interconnection structure is provided on the first surface adjacent to the reflective structure. The interconnection structure may include a portion of the same conductive layer as the reflective structure, as well as an adhesive layer that reduces a reflectivity of the conductive layer. Color filters and/or microlenses are also provided on the second surface of the substrate. Embodiments of the present inventive concept further include methods of fabricating such image sensors, devices including such image sensors, and methods of fabricating such devices.

FIGS. 1 to 9 are cross-sectional views illustrating CMOS image sensor devices and fabrication methods according to some embodiments of the present inventive concept. Referring now to FIG. 1, a second substrate 20 is formed on a first substrate 10. The first and second substrates 10 and 20 may include at least one of silicon (Si), strained silicon, a silicon alloy (such as silicon carbide (SiC), silicon germanium (SiGe) and/or silicon germanium carbide (SiGeC), germanium (Ge), a germanium alloy, gallium arsenide (GaAs), indium arsenide (InAs), a Group III-V semiconductor, a Group II-VI semiconductor, an organic plastic substrate, and/or any combination thereof. In some embodiments, the first substrate 10 and/or the second substrate 20 may be p-type and/or n-type silicon. The second substrate 20 may also be an epitaxial layer that is grown on the first substrate 10.

Still referring to FIG. 1, a light sensing region 110 is formed in the second substrate 20. The light sensing region 110 is configured to receive incident light and generate and/or accumulate an electric charge corresponding to the intensity of the incident light. For example, the light sensing region 110 may be a photodiode, a phototransistor, a photo gate, a pinned photodiode, and/or combinations thereof. The depth or thickness of the light sensing region 110 may be selected based on a wavelength of the incident light. For example, the light sensing region 110 may be formed to a greater depth for incident light having relatively long wavelengths. One or more gate structures 120 are provided on a surface of the second substrate 20 opposite the first substrate 10, which is designated as the front side FS of the image sensor devices described herein. The gate structures 120 may include a charge transfer gate, a reset gate, a drive gate, and/or combinations thereof. The gate structures 120 are laterally offset such that the gate structures 120 are not aligned with the light sensing regions 110. As such, the gate structures 120 are provided between adjacent light sensing regions 110 in plan view. An interlayer dielectric layer 130 is formed on the second substrate 20 and the gates 120. The interlayer dielectric layer 130 may be formed using a chemical vapor deposition (CVD) and/or a thermal oxidation method. A first adhesive layer 1110a is formed on a surface of the interlayer dielectric layer 130. The first adhesive layer 1110a may be titanium (Ti), titanium nitride (TiN), and/or a combination thereof. The first adhesive layer 1110 a may be used to affix a first conductive layer 1120a to the interlayer dielectric layer 130 in a subsequent step, as discussed below with reference to FIG. 3. The first adhesive layer 1110a may be further configured to prevent electron migration from the first conductive layer 1120a toward the interlayer dielectric layer 130.

Figure 2:
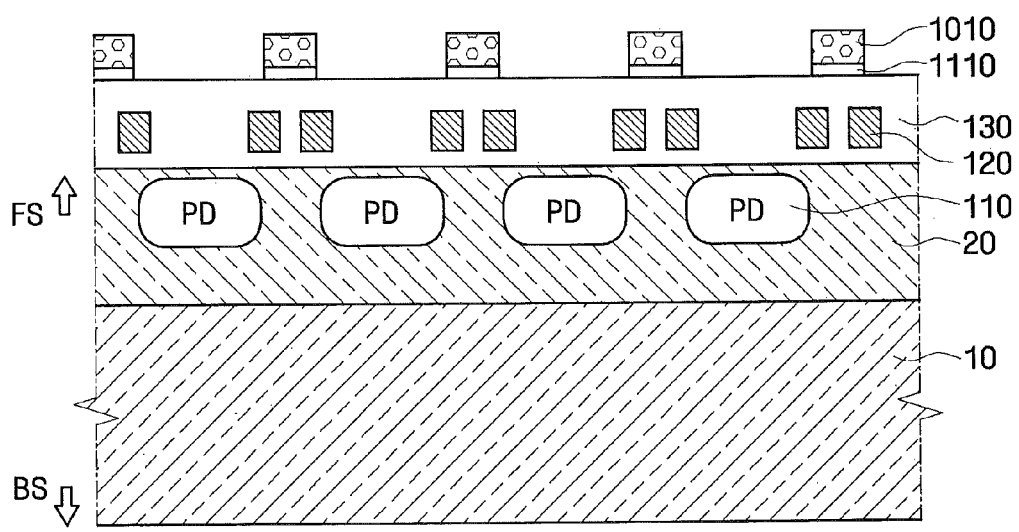

Referring now to FIG. 2, a first photo resist pattern 1010 is formed on the adhesive layer 1110a, and the first adhesive layer 1110a is patterned using the first photo resist pattern 1010 as a mask to define a first adhesive layer pattern 1110. In particular, using the first photo resist pattern 1010 as a mask, portions of the first adhesive layer 1110a that are directly over or above the light sensing region 110 are removed to expose portions of the interlayer dielectric layer 130.

Figure 3:
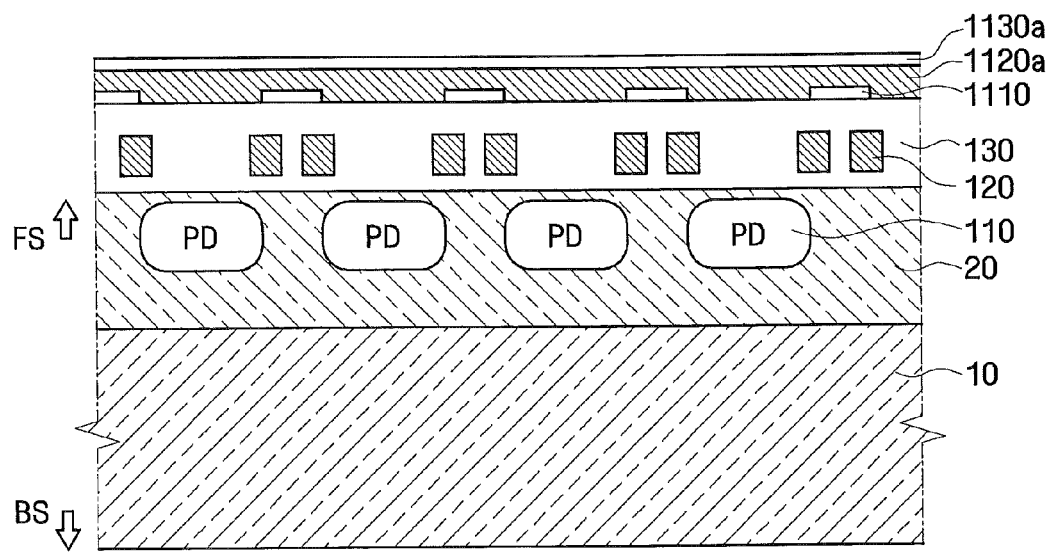

As shown in FIG. 3, the first photo resist pattern 1010 is removed, and a first conductive layer 1120a is formed on the first adhesive layer pattern 1110 and on the interlayer dielectric layer 130. The first conductive layer 1120a may be aluminum (Al), copper (Cu), and/or other conductive materials. As discussed in greater detail below, the adhesive layer pattern 1110 is configured to reduce a reflectivity of the portions of the first conductive layer 1120a formed thereon. A first capping layer 1130a is formed on the first conductive layer 1120a. The first capping layer 1130a may include titanium (Ti), titanium nitride (TiN), and/or a combination thereof. The capping layer 1130a is configured to act as a protective layer for the conductive layer 1120a.

Figure 4:
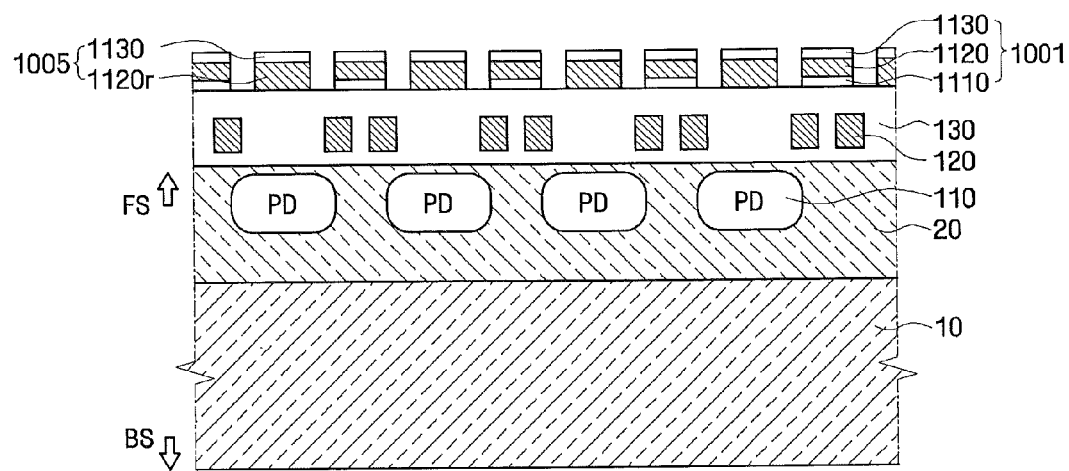

Referring now to FIG. 4, the first capping layer 1130a, the first conductive layer 1120a, and the first adhesive layer pattern 1110 are patterned using an etch mask to define a first interconnection structure or pattern 1001 and a first reflective structure or pattern 1005. The first interconnection structure 1001 includes the first adhesive layer pattern 1110, the first conductive layer pattern 1120, and a first capping layer pattern 1130. The first reflective structure 1005 includes a first reflective pattern 1120r and the first capping layer pattern 1130. The first reflective pattern 1120r is greater than the first conductive layer pattern 1120 in thickness. Where copper is used as the conductive layer 1120a, the first conductive layer pattern 1120 and the first reflective layer pattern 1120r may be formed using a single damascene or a dual damascene method. The first interconnection structure 1001 may be electrically connected to one or more of the gates 120. The first reflective structure 1005 may or may not be electrically connected to the gates 120.

Still referring to FIG. 4, the first interconnection structure 1001 and the first reflective structure 1005 are provided adjacent to one another on a surface of the interlayer dielectric layer 130 such that the first reflective structures 1005 are provided over and aligned with the light sensing regions 110 in the second substrate 20 therebelow. The gate structures 120 are laterally offset in the interlayer dielectric layer 130 such that they do not obstruct the passage of light between the light sensing region 110 and the first reflective structure 1005. The reflective layer pattern 1120r of the first reflective structure 1005 is configured to reflect portions of the incident light that pass through the light sensing region 110 back toward the light sensing region 110. The first interconnection structure 1001, however, has a lower reflectivity than the first reflective structure 1005, due to the presence of the first adhesive layer pattern 1110. In particular, the first adhesive layer pattern 1110 reduces the reflectivity of the first interconnection structure 1001 relative to that of the first reflective layer pattern 1120r of the first reflective structure 1005. The first reflective layer pattern 1120r has a thickness equal to the combined thickness of the first adhesive layer pattern 1110 and the first conductive layer pattern 1120 of the first interconnection structure 1001.

Figure 5:
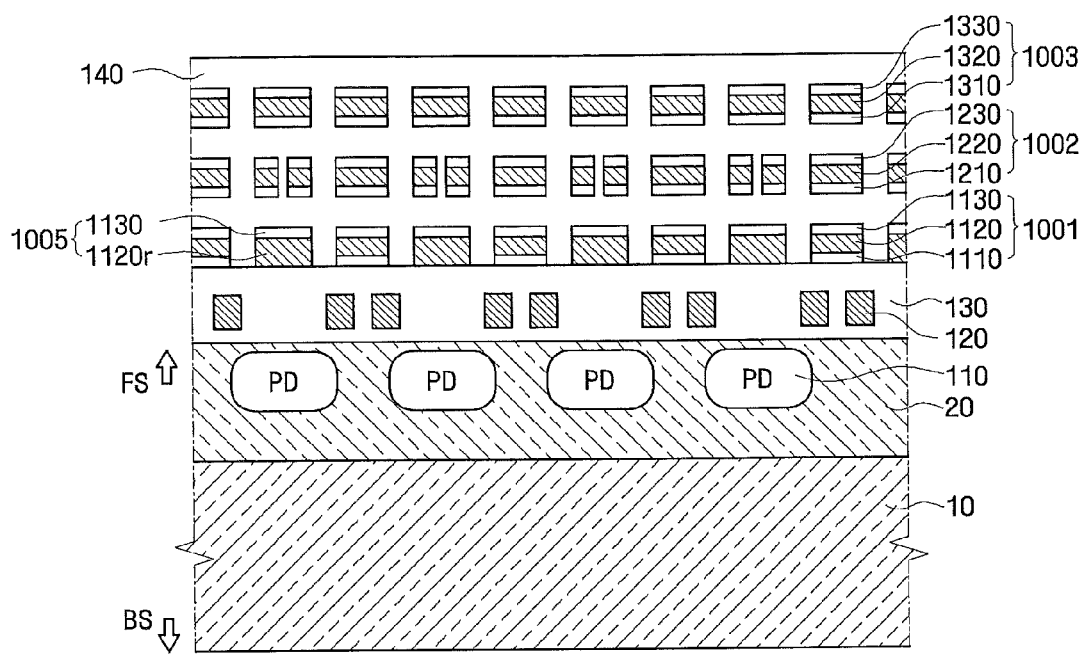

As shown in FIG. 5, a second interconnection structure 1002 and a third interconnection structure 1003 are formed in an intermetal dielectric layer 140. In particular, second interconnection structure 1002 includes a second adhesive layer pattern 1210, a second conductive layer pattern 1220, and a second capping pattern 1230. Likewise, the third interconnection structure 1003 includes a third adhesive layer pattern 1310, a third conductive layer pattern 1320, and a third capping layer pattern 1330. The second interconnection structure 1002 and/or the third interconnection structure 1003 may be formed on the interlayer dielectric layer 130 in a manner and/or using materials similar to that described above with reference to the first interconnection structure 1001; thus, the fabrication processes used to form the second interconnection structure 1002 and/or the third interconnection structure 1003 will not be described further herein.

Figure 6:
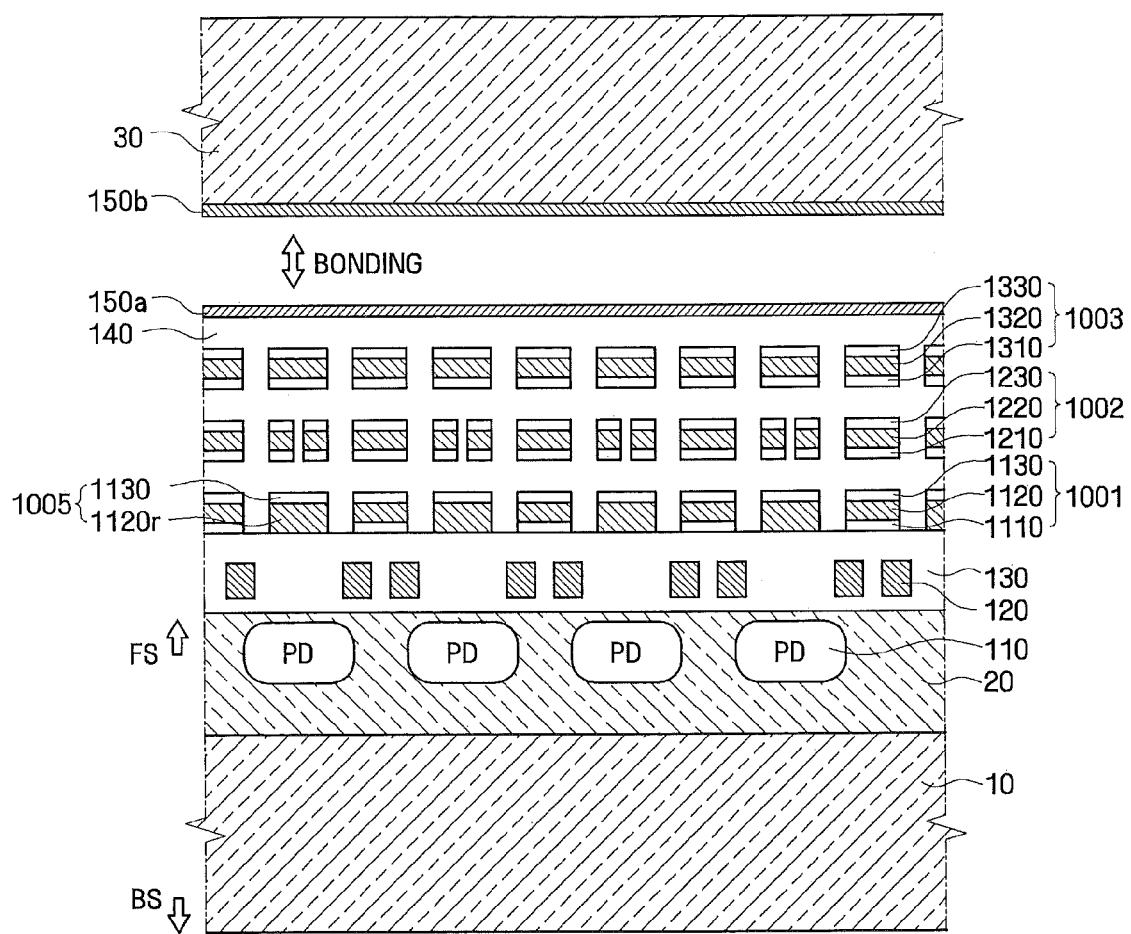

As shown in FIG. 6, a support substrate 30 is attached to the intermetal dielectric layer 140 on the front side FS of the image sensor device on which the gate structures 120 and the interconnection structures are formed. In particular, a bonding layer 150a is formed on a surface of the intermetal dielectric layer 140, and a bonding layer 150b is formed on a surface of the support substrate 30. The bonding layers 150a and 150b are thereby used to attach the support substrate 30 to the surface of the intermetal dielectric layer 140. Alternatively, in some embodiments, the support substrate 30 may be attached to the surface of the intermetal dielectric layer 140 using a plasma treatment. Accordingly, in such embodiments, the bonding layers 150a and 150b may be omitted.

Figure 7:
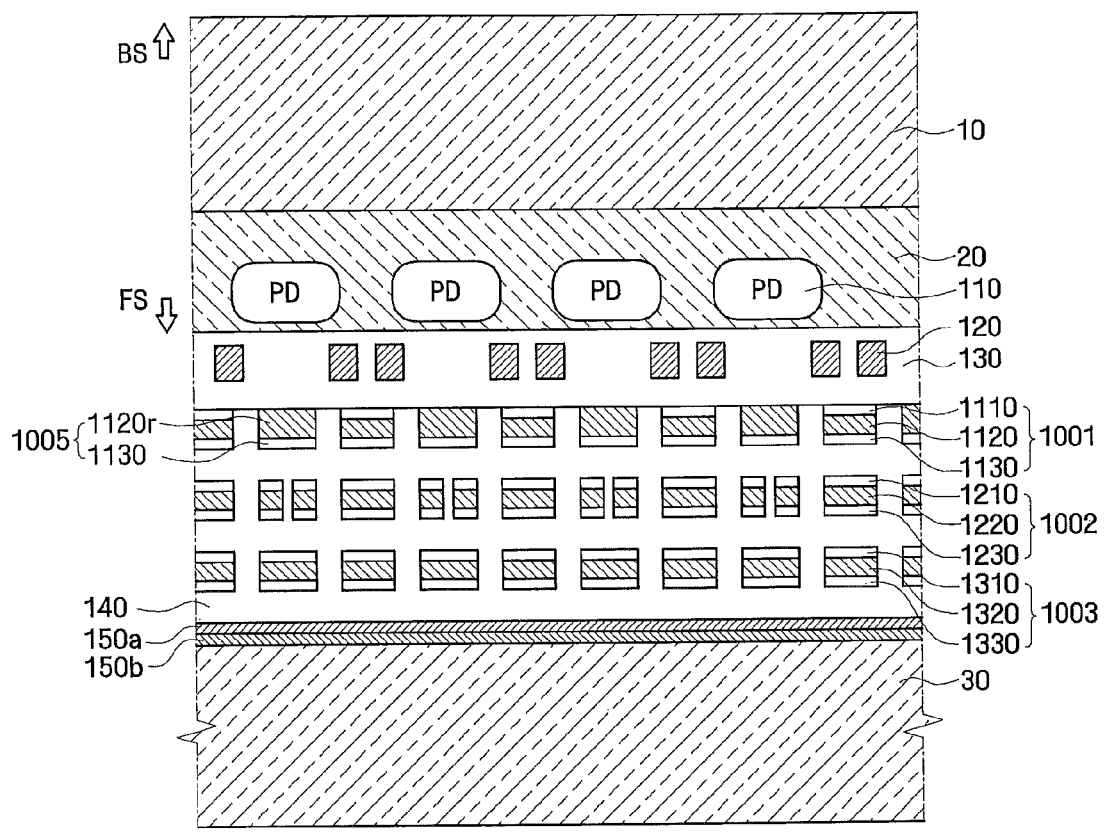
Figure 8:
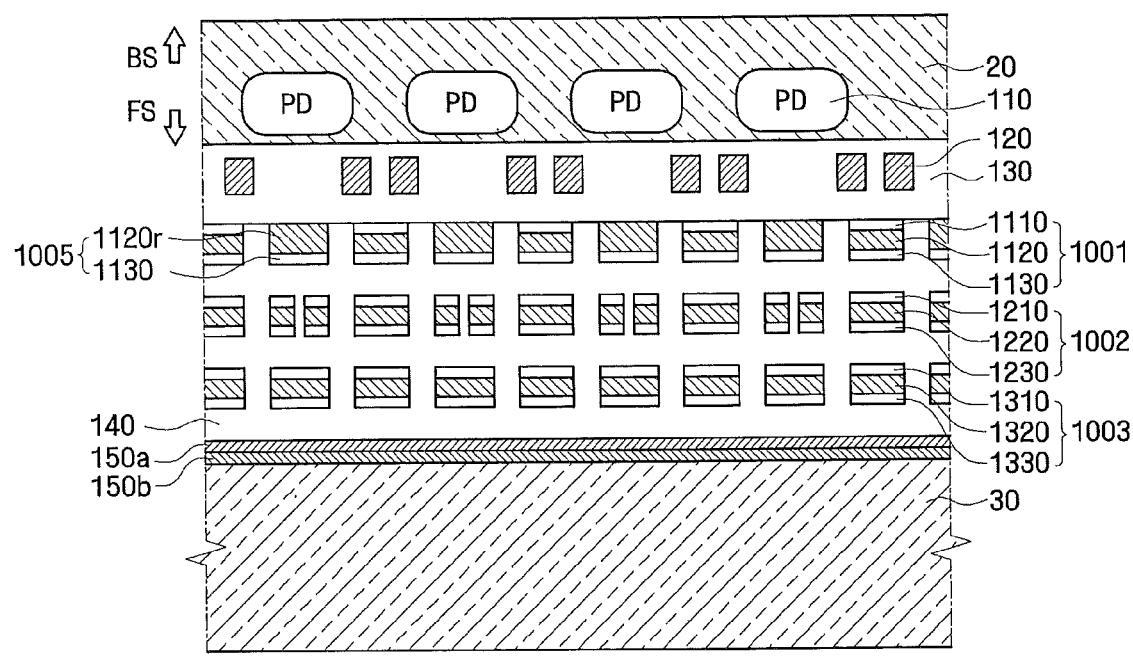

Referring now to FIG. 7, the entire structure including the first substrate 10, the second substrate 20, and the support substrate 30 is turned over or upside down such that the first substrate 10, which is provided on the backside BS of the second substrate 20, is provided on top of the structure. As shown in FIG. 8, the first substrate 10 is partially or entirely removed. For example, the first substrate 10 may be removed using an etching process, a chemical mechanical polishing (CMP) process, and/or a back grinding (BGR) process. Furthermore, portions of the second substrate 20 may also be removed at a predetermined thickness to prevent a crosstalk failure.

Figure 9:
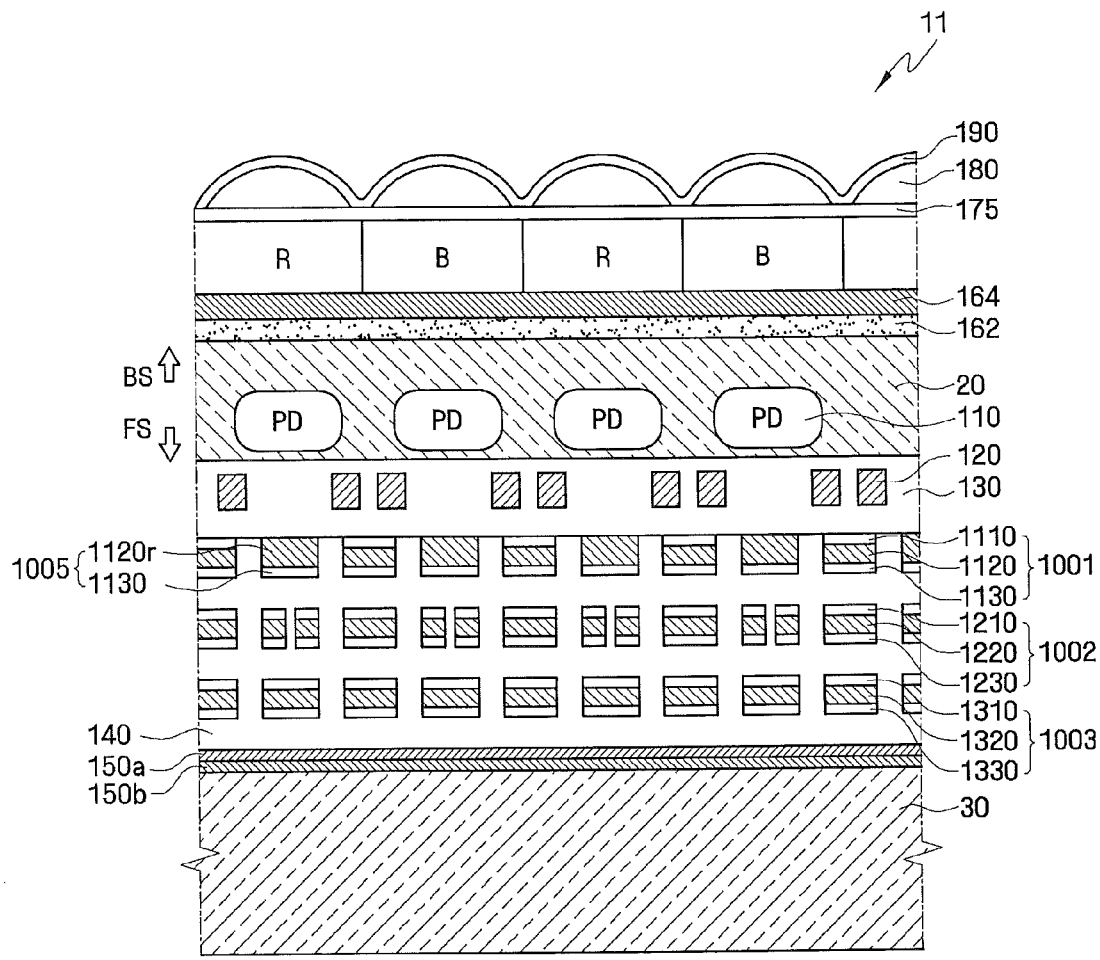

Referring now to FIG. 9, a reflection prevention layer 162 and a lower planarization layer 164 are sequentially formed on the backside BS surface of the second substrate 20 opposite to the front side FS surface of the second substrate 20 on which the interconnection structure 1001 was formed. The reflection prevention layer 162 may be formed of silicon dioxide ($SiO_2$), silicon nitride (SiN), silicon oxynitride (SiON), and/or combinations thereof. The lower planarization layer 164 may be formed of silicon dioxide ($SiO_2$). As shown in FIG. 9, a color filter 170, an upper planarization layer 175, a micro-lens 180, and a protection layer 190 are sequentially formed on the lower planarization layer 164 to complete the backside illuminated sensor (BIS) device 11. The upper planarization layer 175 may be formed of silicon dioxide ($SiO_2$). The microlens 180 may be an organic material (such as a photoresist layer) or an inorganic material. The protection layer 190 may be an inorganic material such as silicon dioxide ($SiO_2$) (for example, a low temperature oxide (LTO)), titanium dioxide ($TiO_2$), zirconium dioxide ($ZrO_2$), hafnium dioxide ($HFO_2$), and/or combinations thereof.

In the backside illuminated sensor 11 of FIG. 9, incident light enters the light sensing region 110 through the microlens 180 and the color filter 170. In particular, the microlens 180 is configured to direct the incident light to the light sensing region 110. However, due to the relatively shallow depth of the light sensing regions 110, light having relatively long wavelengths (for example, light having wavelengths greater than about 500 nanometers (nm)) may pass through the light sensing region 110 to the reflective structure 1005 including the first reflection layer pattern 1120r thereunder. Accordingly, in embodiments of the present inventive concept, the light that passes through the light sensing region 110 is reflected by the underlying first reflection layer pattern 1120r back toward the light sensing region 110, thereby decreasing light outflow or loss. The interconnection structure 1001, however, reflects significantly less of the light that passes through the light sensing region 110 than the reflective structure 1005, as the adhesive layer pattern 1110 reduces a reflectivity of the conductive layer pattern 1120 thereof.

Figure 10:
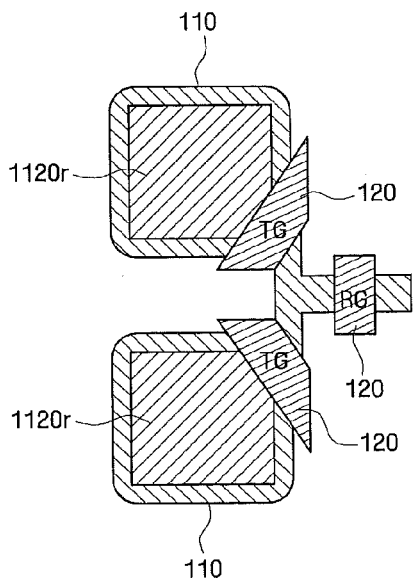
FIG. 10 is a plan view further illustrating the reflective layer patterns of FIG. 9.

FIG. 10 further illustrates the reflective layer pattern 1120r of FIG. 9 in plan view. As shown in FIG. 10, the reflective layer pattern 1120r may be patterned to provide a shape substantially similar to that of the light sensing region 110. The reflective layer pattern 1120r is aligned with the light sensing region 110 in plan view such that the portions of the incident light that pass through the light sensing region 110 are incident on the reflective layer pattern 1120r. In some embodiments, the reflection layer pattern 1120r may be a line shape extending on the interlayer dielectric layer 130 under the light sensing region 110. The gate structures 120, which may include transfer gates TG and/or reset gates RG, are also illustrated in FIG. 10.

Figure 11:
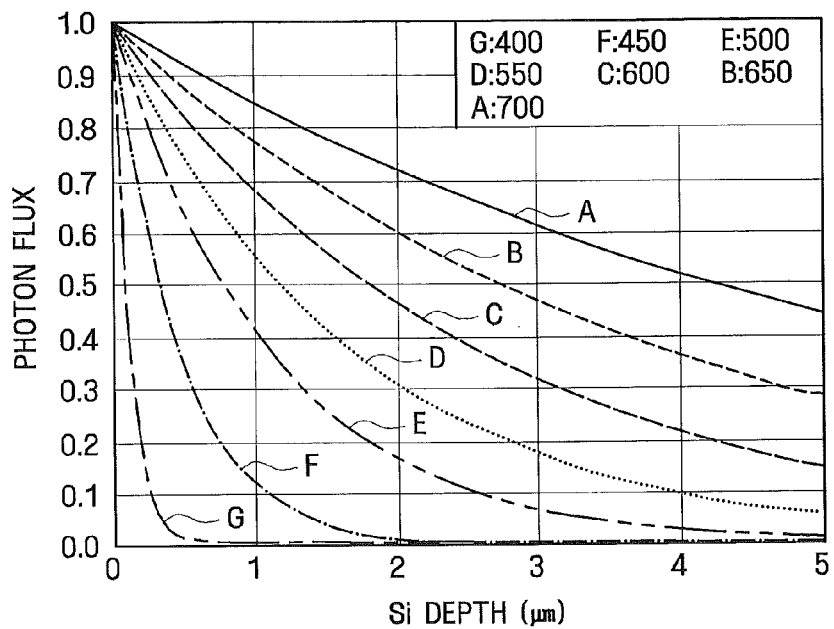
FIG. 11 is a graph illustrating photodiode depth versus degree of photon flux for several wavelengths of incident light in accordance with some embodiments of the present inventive concept.

FIG. 11 is a graph illustrating photodiode depth versus degree of photon flux for several wavelengths of incident light in accordance with some embodiments. In backside illuminated sensors (BIS) according to some embodiments of the inventive concept, photodiode depths are formed relatively shallow (for example, about 5 micrometers (µm) or less) by ion implanting impurities in the second substrate 20. As shown in FIG. 11, light having relatively short wavelengths of less than about 500 nm (labeled as G, F, and E in FIG. 11) do not provide significant light outflow (or photon flux) beyond depths of about 5 µm. Accordingly, light outflow for light having wavelengths of less than about 500 nm may not be significantly affected by photodiodes having depths in accordance with embodiments of the present inventive concept. In contrast, light having relatively long wavelengths of greater than about 500 nm (labeled as A, B, C, and D in FIG. 11) provides significant photon flux at depths of more than about 5 µm of photodiodes. As such, light outflow for light having wavelengths of greater than about 500 nm may be affected based on the depth of the photodiode or other light sensing region. However, the reflective and interconnection structures 1005 and 1001 discussed above direct much of this light back to the photodiode, thereby decreasing light outflow for light having wavelengths of greater than about 500 nm despite the relatively shallow photodiode depths.

Figure 12:
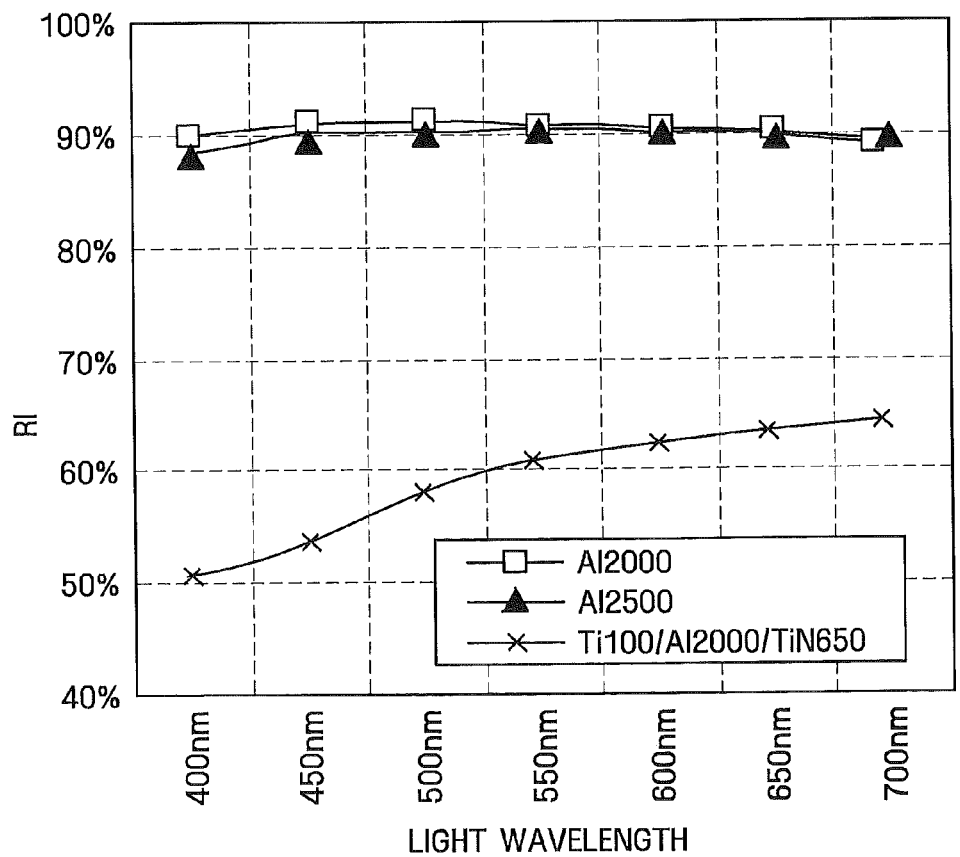
FIG. 12 is a graph illustrating reflection rates of incident light based on the materials of the reflective and interconnection structures according to some embodiments of the present inventive concept.

FIG. 12 is a graph illustrating reflection rates of incident light for the interconnection structures 1001 and the reflective structures 1005 discussed above. As shown in FIG. 12, for reflective structures 1005 including Al having a thickness of about 2000 Å or about 2500 Å as the reflective layer pattern 1120r, the reflection rate of incident light having wavelengths between about 400 nm and about 700 nm is about 90%. In contrast, for interconnection structures 1001 including an adhesive layer pattern 1110 of Ti having a thickness of about 100 Å, a conductive layer pattern 1120 of Al having a thickness of about 2000 Å, and a capping layer pattern 1130 of TiN having a thickness of about 650 Å, the reflection rate of incident light having wavelengths of about 400 nm to about 700 nm is about 50% to about 65%, due the light absorption by the adhesive layer pattern 1110.

Figure 13:
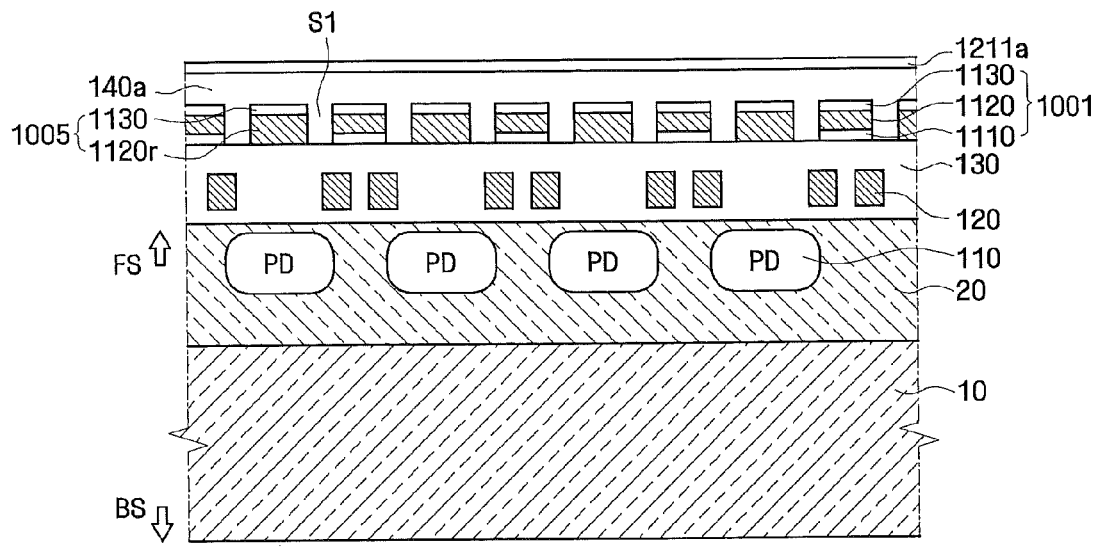
FIGS. 13 to 18 are cross-sectional views illustrating intermediate fabrication steps for forming image sensors in accordance with embodiments of the present inventive concept.

FIGS. 13 to 18 are cross-sectional views illustrating intermediate fabrication steps for forming image sensor devices in accordance with further embodiments of the present inventive concept. Referring now to FIG. 13, after forming the first interconnection structures 1001 and the first reflective structures 1005 on the interlayer dielectric layer 130 as shown in FIG. 4, a first intermetal dielectric layer 140a is formed on the first interconnection structures 1001 and on the first reflective structures 1005. A second adhesive layer 1211a is formed on a surface of the first intermetal dielectric layer 140a. The second adhesive layer 1211a may be formed of titanium (Ti), titanium nitride (TiN), and/or a combination thereof.

Figure 14:
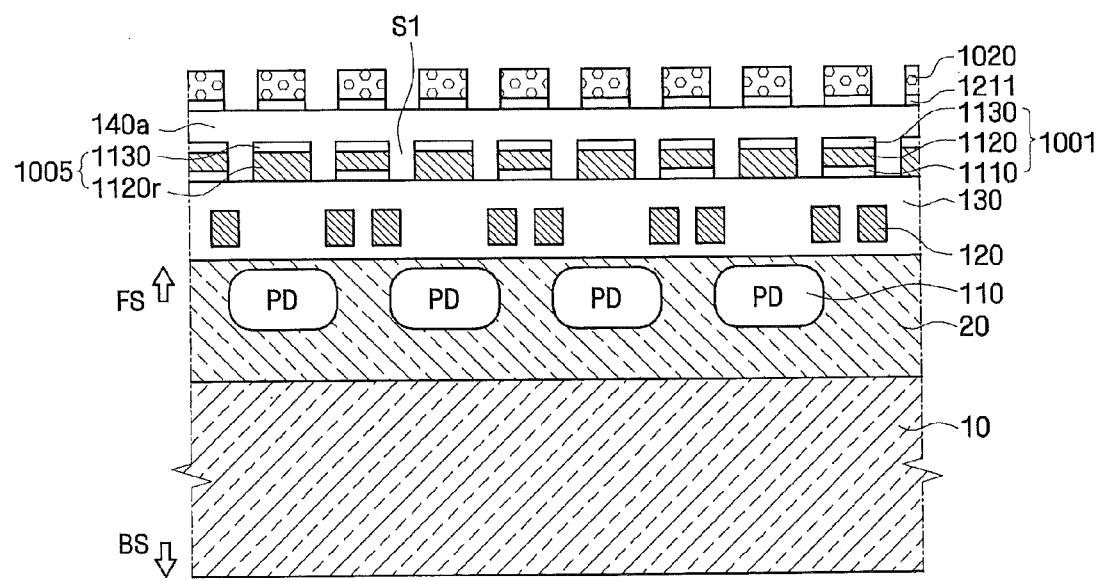

Referring now to FIG. 14, a second photo resist pattern 1020 is formed on the second adhesive layer 1211a, and the second adhesive layer 1211a is etched using the second photo resist pattern 1020 as a mask to define a second adhesive layer pattern 1211. The second adhesive layer pattern 1211 exposes portions of the intermetal dielectric layer 140a that are directly above or over areas S1 between a reflective structure 1005 and an adjacent interconnection structure 1001. As such, in some embodiments, the second adhesive layer pattern 1211 may be aligned over one or more of the interconnection structures 1001 and/or the reflective structures 1005.

Figure 15:
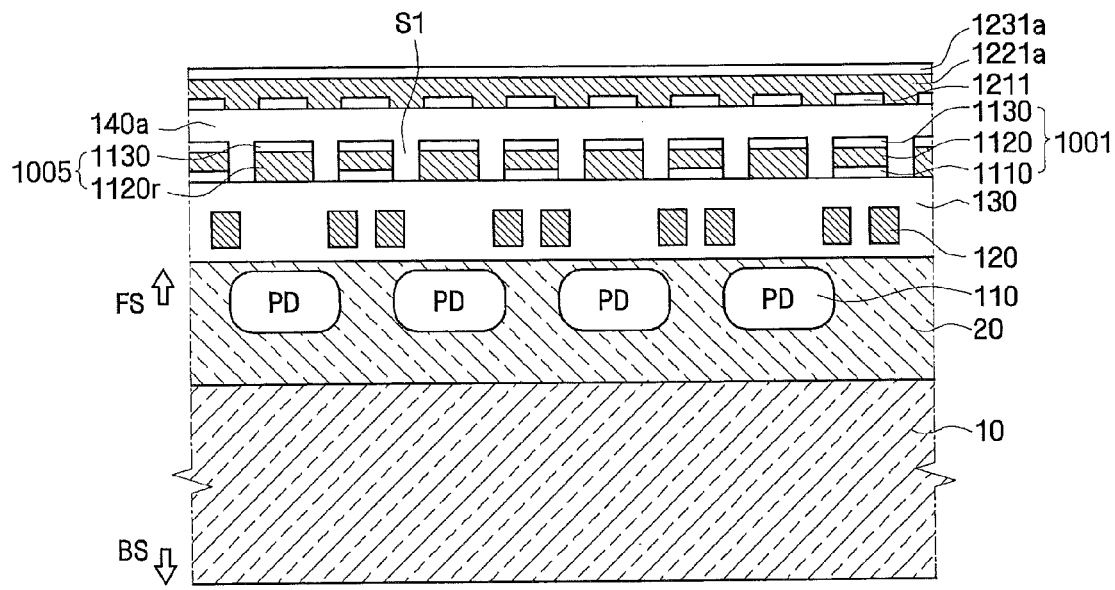

As shown in FIG. 15, the second photo resist pattern 1020 is removed, and second conductive layer 1221a and a second capping layer 1231a are sequentially formed on the second adhesive layer pattern 1211 and the first intermetal dielectric layer 140a. In some embodiments, the second conductive layer 1221a may be formed of a same material as the first conductive layer 1120a. Also, in some embodiments, the second capping layer 1231a may be formed of a same material as the first capping layer 1130a.

Figure 16:
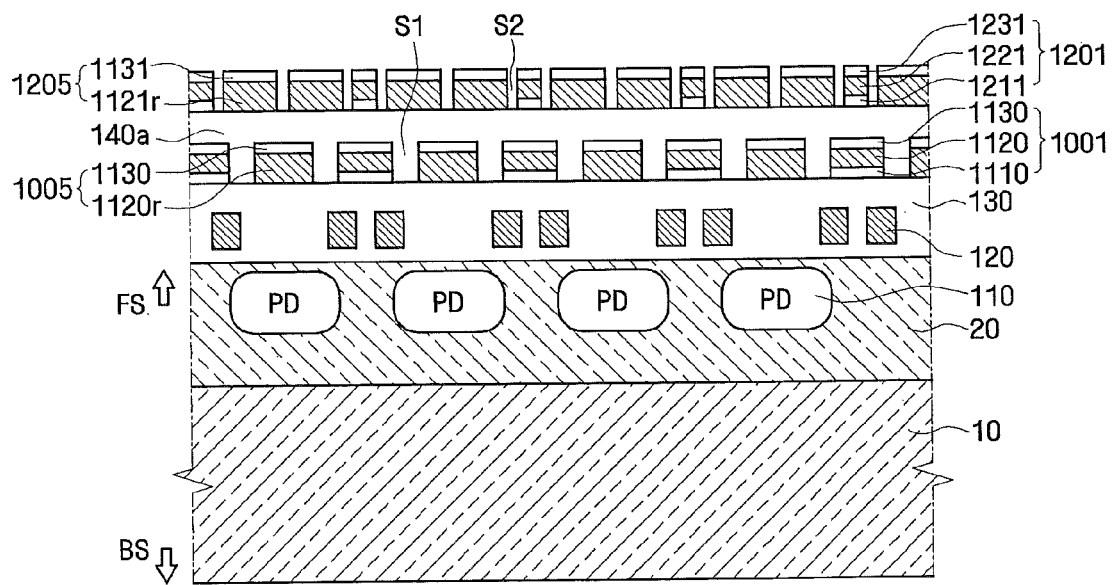

Referring now to FIG. 16, the second capping layer 1231a, the second conductive layer 1221a, and the second adhesive layer pattern 1211 are patterned using the same etch mask to define second interconnection structures 1201 and second reflective structures 1205. The second interconnection structures 1201 include the second adhesive layer pattern 1211, the second conductive layer pattern 1221, and the second capping layer pattern 1231. The second reflective structures 1205 include the second reflective pattern 1221r and the second capping layer pattern 1231. The second reflective layer patterns 1221r are formed directly over the areas S1 between a first reflective structure 1005 and an immediately adjacent first interconnection structure 1001. Also, areas S2 between adjacent ones of the second reflective structure 1205 are aligned over ones of the first reflective structures 1005 therebelow. As such, the second reflective structure 1205 is formed over (or under when the entire structure is flipped in FIG. 17) at least a portion of a light sensing region 110 and laterally offset from a first reflective structure 1005. The second reflective structures 1205 may be formed on opposite sides of the first reflective structure 1005 therebelow and aligned with portions of the light sensing region 110 that extend beyond the first reflective structure 1005 in plan view. Accordingly, the second reflective structures 1205 are configured to reflect portions of the incident light that pass through the light sensing region 110 and are not reflected by the first reflective structure 1005 back towards the light sensing region 110. The second interconnection structures 1201 may be formed over a first interconnection structure 1001 on the intermetal dielectric layer 140a therebelow and between ones of the second reflective structures 1205. The second interconnection structures 1201 may be narrower in width than the first interconnection structures 1001, as shown in FIG. 16.

Figure 17:
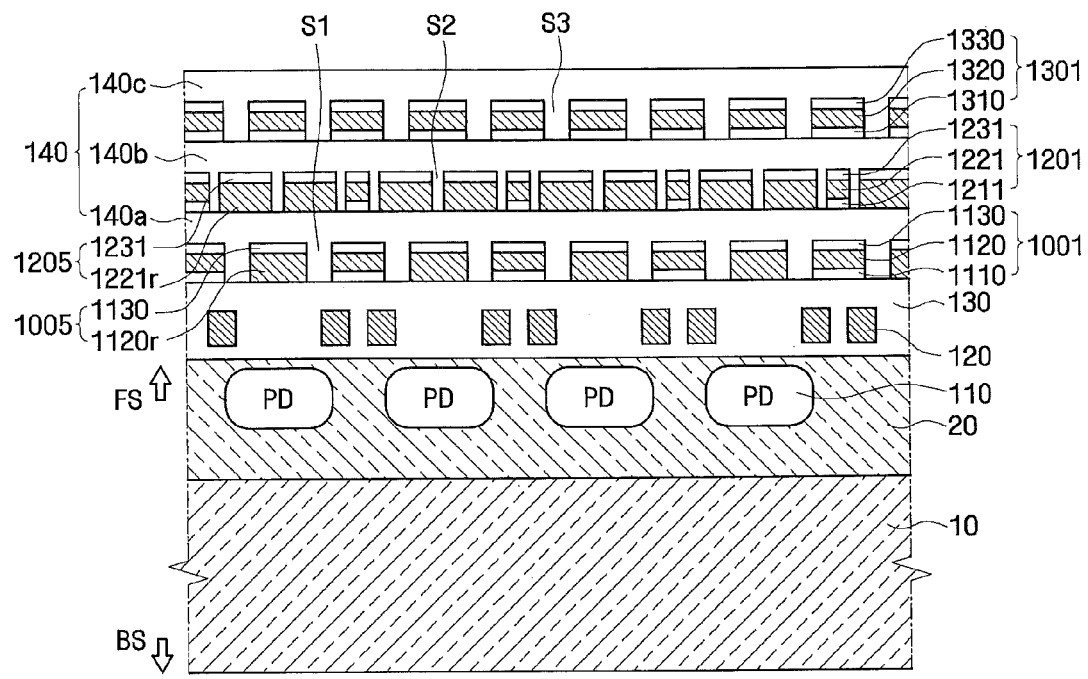

Referring now to FIG. 17, a second intermetal dielectric layer 140b is formed on the second interconnection structures 1201 and the second reflective structures 1205. Third interconnection structures 1301 are formed on a surface of the second intermetal dielectric layer 140b. The third interconnection structures include a third adhesive layer pattern 1310, a third conductive layer pattern 1320, and a third capping layer pattern 1330. Accordingly, the third interconnection structures 1301 may have a structure and/or may be formed by a fabrication process similar to that of the first interconnection structures 1001 and/or the second interconnection structures 1201. As such, the fabrication of the third interconnection structures 1301 will not be further described herein. Areas S3 between adjacent ones of the third interconnection structures 1301 may be aligned with ones of the second reflective structures 1205 therebelow. Also, a third intermetal dielectric layer 140c is formed on the third interconnection structures 1301.

Figure 18:
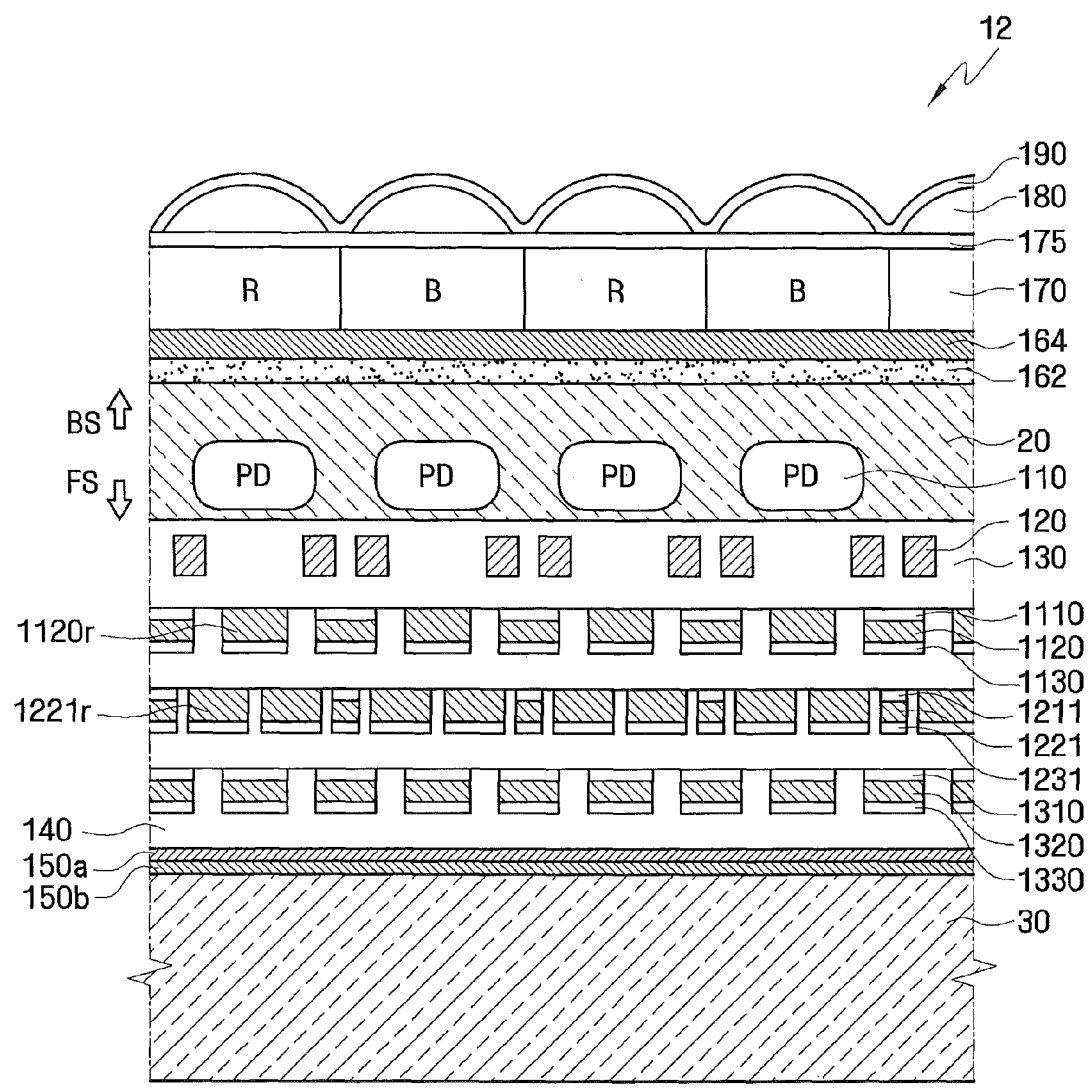

Referring now to FIG. 18, a support substrate 30 is bonded to a surface of the third intermetal dielectric layer 140c, the entire structure is turned over and/or flipped upside down, and the first substrate 10 is partially or entirely removed in a manner similar to that described above with reference to FIGS. 6-8. A thickness of the second substrate 20 may also be reduced in some embodiments. Likewise, a reflection prevention layer 162, a lower planarization layer 164, a color filter 170, an upper planarization layer 175, a micro-lens 180, and a protective layer 190 are sequentially formed on the backside of the second substrate 20 in a manner similar to that described above with reference to FIG. 9 to complete the backside illuminated image sensor device 12 according to some embodiments of the present inventive concept.

Figure 19:
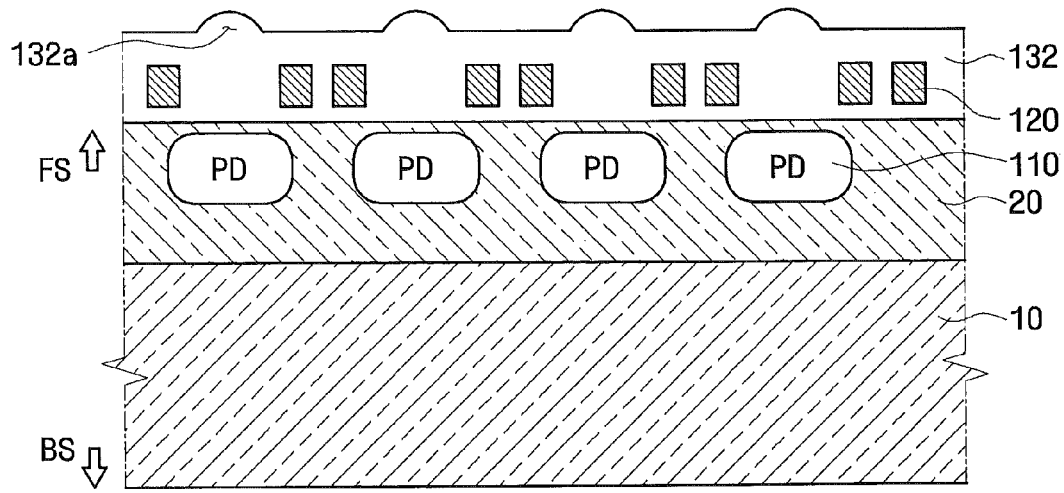
FIGS. 19 to 26 are cross-sectional views illustrating intermediate fabrication steps for forming image sensors in accordance with further embodiments of the present inventive concept.
Figure 20:
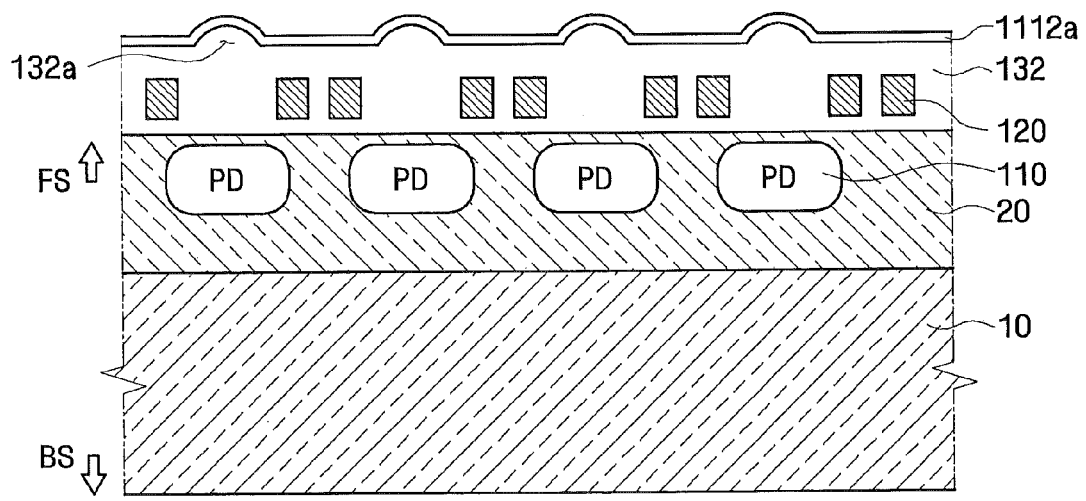

FIGS. 19 to 25 are cross-sectional views illustrating intermediate fabrication steps for forming image sensor devices in accordance with further embodiments of the present inventive concept. Referring now to FIG. 19, an interlayer dielectric layer 132 is formed on the front side FS of the second substrate 20 including the light sensing regions 110 therein. Convex patterns 132a are formed over and aligned with ones of the light sensing regions 110 by patterning the interlayer dielectric layer 132. However, concave patterns (not shown), rather than the convex patterns 132a, may be formed in the interlayer dielectric layer 132 in some embodiments. As shown in FIG. 20, a first adhesive layer 1112a is conformally formed on the convex patterns 132a and the planar portions therebetween of the interlayer dielectric layer 132. The adhesive layer 1112a may be titanium (Ti), titanium nitride (TiN), and/or combinations thereof, and may be similar to the adhesive layer 1110a described above.

Figure 21:
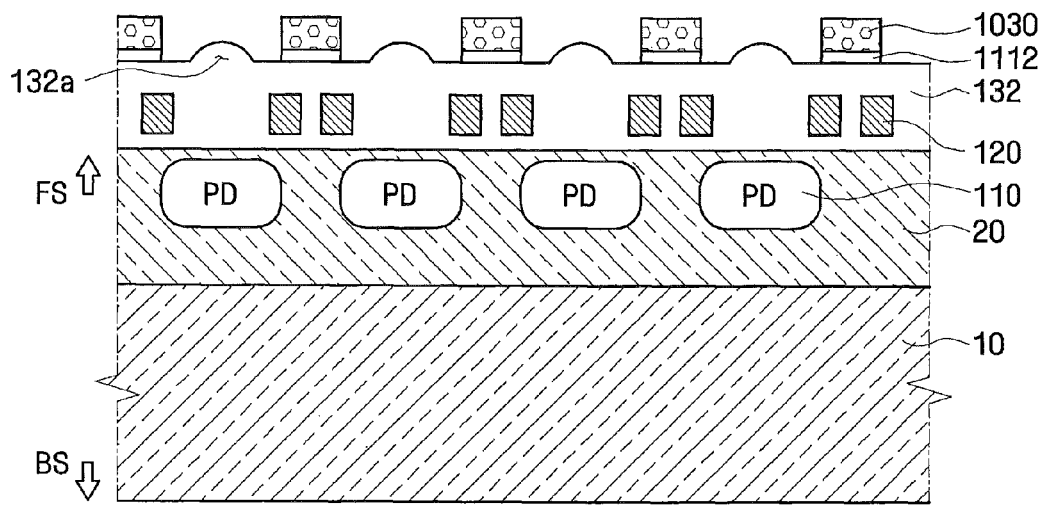
Figure 22:
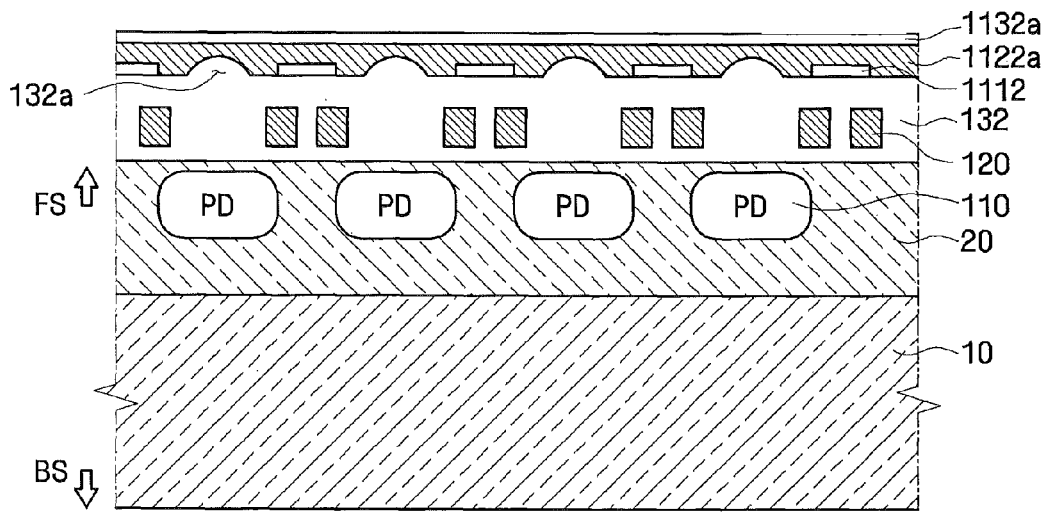

Referring now to FIG. 21, a photo resist pattern 1030 is formed on the first adhesive layer 1112a, and the first adhesive layer 1112a is etched using the photo resist pattern 1030 as an etch mask to define a first adhesive layer pattern 1112 on the planar portions of the interlayer dielectric layer 132 between the convex patterns 132a thereof. As shown in FIG. 22, the photo resist pattern 1030 is removed, and a first conductive layer 1122a and a first capping layer 1132a are sequentially formed on the first adhesive layer pattern 1112 and on the convex patterns 132a of the interlayer dielectric layer 132 exposed therebetween.

Figure 23:
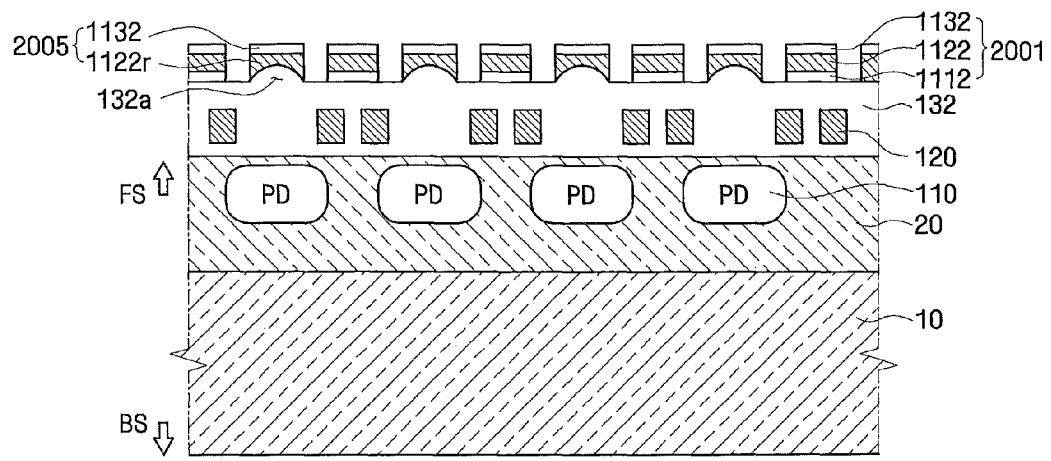

Referring now to FIG. 23, the first capping layer 1132a, a first conductive layer 1122a, and the first adhesive layer pattern 1112 are sequentially patterned using a same etch mask to define a first interconnection structure 2001 and a first reflective structure 2005 adjacent thereto on a surface of the interlayer dielectric layer 132. The first interconnection structure 2001 includes the first adhesive layer pattern 1112, the first conductive layer pattern 1122, and the first capping layer pattern 1132. The first reflective structure 2005 includes a first reflective layer pattern 1122r and the first capping layer pattern 1132. The first reflective structure 2005 is formed on the convex portions 132a of the interlayer dielectric layer 132. As such, the first reflective layer pattern 1122r has a concave surface aligned with and facing the light sensing region 110 in the second substrate 20 therebelow. However, it is to be understood that in embodiments where the interlayer dielectric layer 132 is formed to include concave patterns therein (not shown), the first reflective layer pattern 1122r may have a convex surface aligned with and facing the light sensing region 110 when formed in accordance with the fabrication methods described above.

Figure 24:
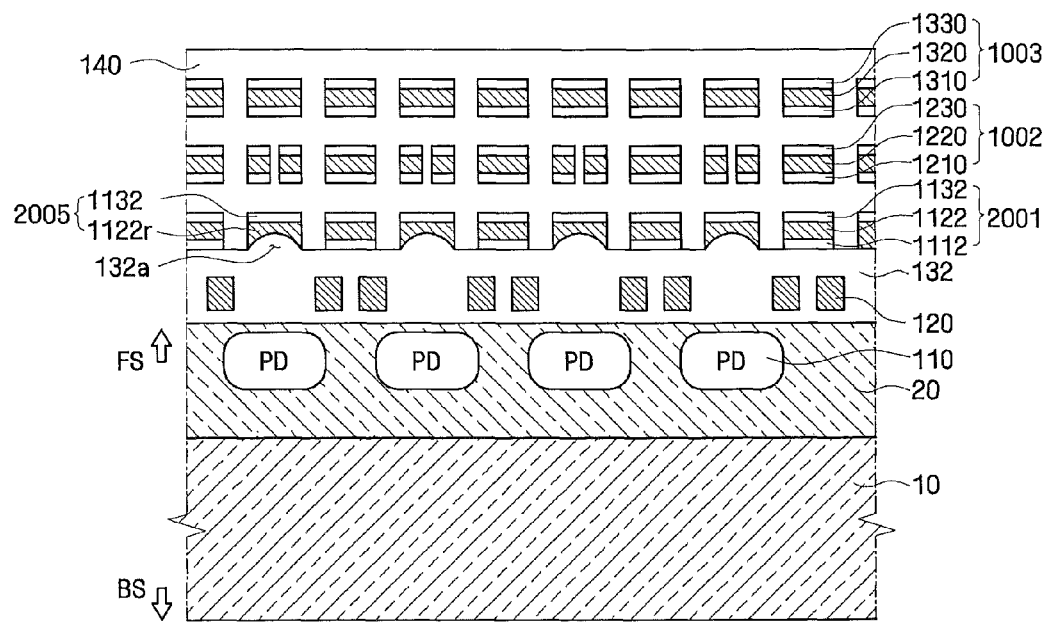

As shown in FIG. 24, a second interconnection structure 1002 and a third interconnection structure 1003 are formed in an intermetal dielectric layer 140. In particular, the second interconnection structure 1002 includes a second adhesive layer pattern 1210, a second conductive layer pattern 1220, and a second capping pattern 1230. Likewise, the third interconnection structure 1003 includes a third adhesive layer pattern 1310, a third conductive layer pattern 1320, and a third capping layer pattern 1330. The second interconnection structure 1002 and/or and the third interconnection structure 1003 may be formed on the interlayer dielectric layer 130 in a manner and/or using materials similar to that described above with reference to FIG. 5; thus the fabrication processes used to form the second interconnection structure 1002 and/or the third interconnection structure 1003 will not be further described herein.

Figure 26:
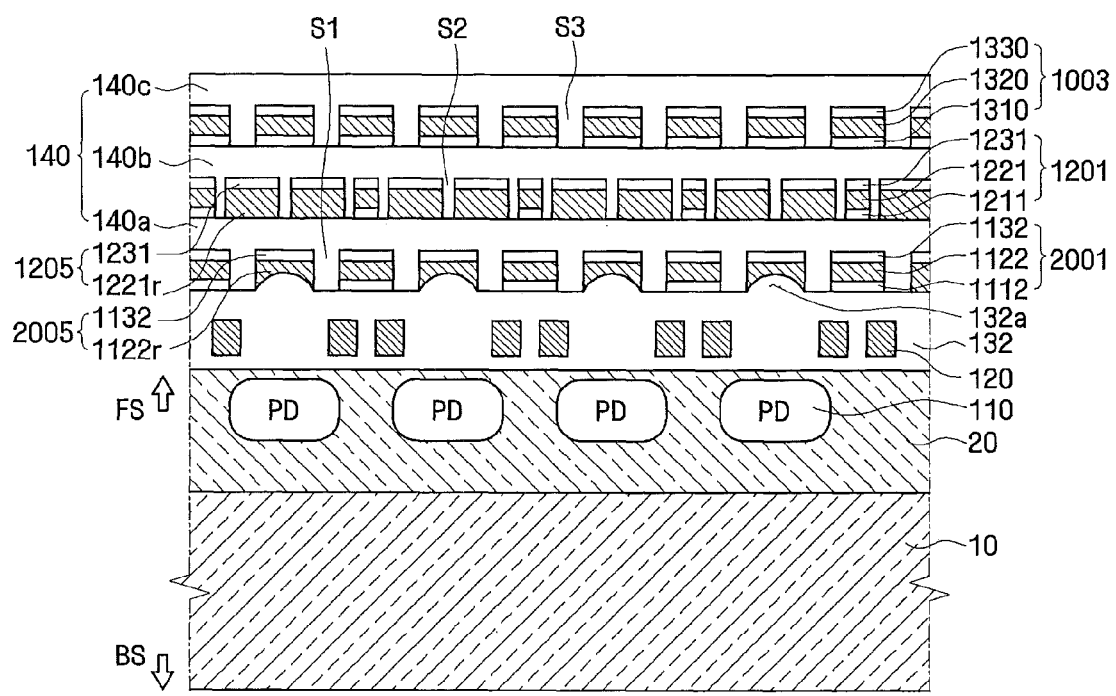

Also, in some embodiments as shown in FIG. 26, second reflective structures 1205 (including a second reflective pattern 1221r and a second capping layer pattern 1231) may be formed over areas S1 between first reflective structures 2005 and immediately adjacent first interconnection structures 2001 such that areas S2 between adjacent ones of the second reflective structures 1205 are aligned with one of the first reflective structures 2005 therebelow. As such, the second reflective structures 1205 are laterally offset from the first reflective structures 2005 and are configured to reflect portions of the incident light that are not reflected by the first reflective structures 2005, as similarly described with reference to FIG. 16.

Figure 25:
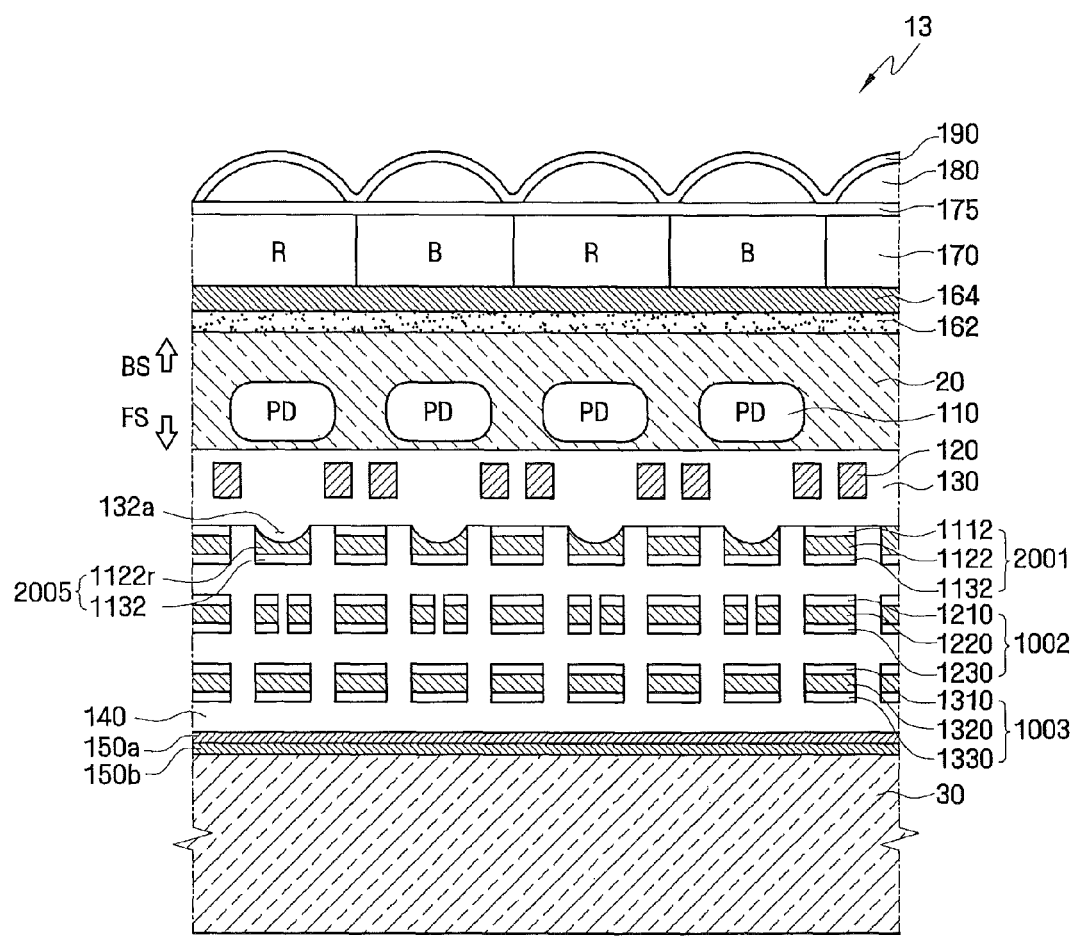

Referring now to FIG. 25, a support substrate 30 is bonded to a surface of the intermetal dielectric layer 140, the entire structure is turned over and/or flipped upside down, and the first substrate 10 is partially or entirely removed in a manner similar to that described above with reference to FIGS. 6-8. A thickness of the second substrate 20 may also be reduced in some embodiments. Likewise, a reflection prevention layer 162, a lower planarization layer 164, a color filter 170, an upper planarization layer 175, a micro-lens 180, and a protective layer 190 are sequentially formed on the backside BS of the second substrate 20 in a manner similar to that described above with reference to FIG. 9 to complete the backside-illuminated image sensor device 13 according to some embodiments of the present inventive concept.

Figure 27:
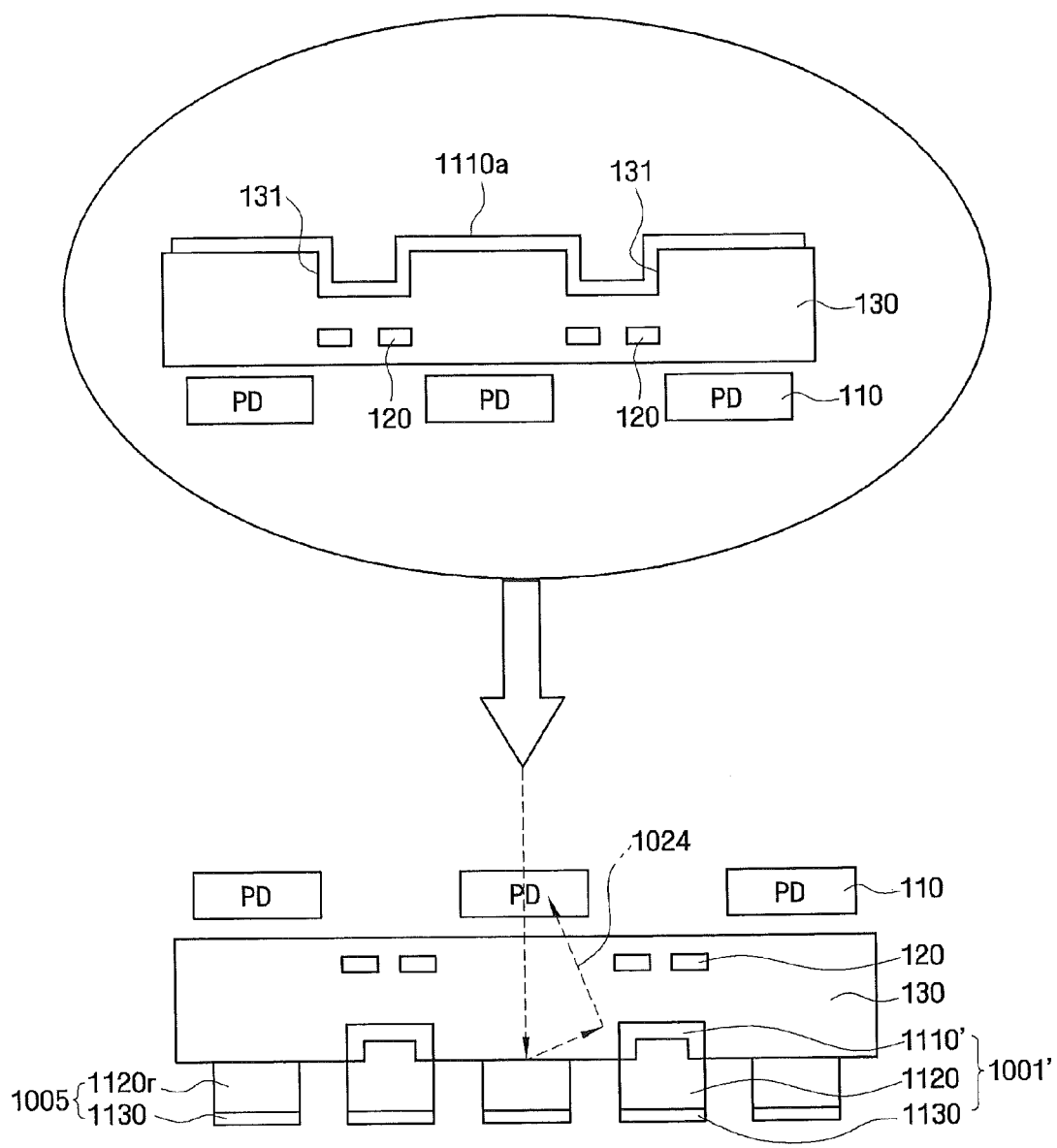
FIGS. 27 and 28 illustrate additional methods for fabricating reflective and interconnection structures according to some embodiments of the present inventive concept.
Figure 28:
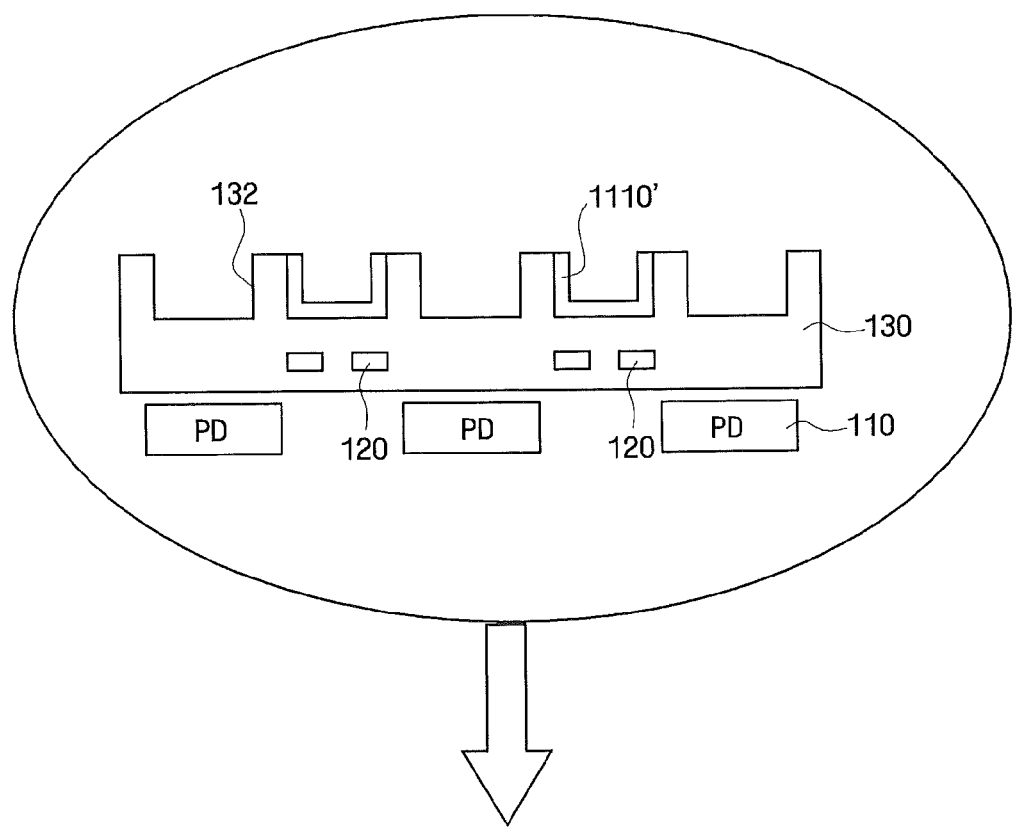
Figure 28:
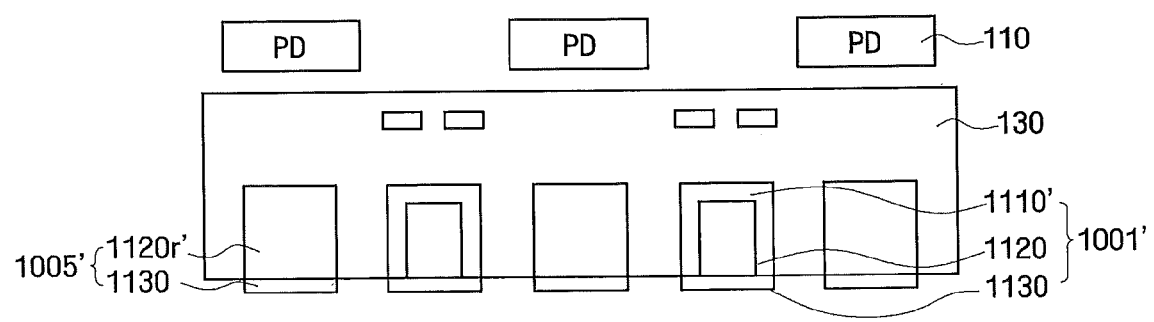

FIGS. 27 and 28 illustrate additional methods for fabricating the reflective structures 1005 and the interconnection structures 1001 described above. Referring now to FIG. 27, before forming the adhesive layer 1110a in FIG. 1, recesses 131 are formed in the interlayer dielectric layer 130 over the gate structures 120 therein. In particular, the recesses 131 are aligned with the gate structures 120. The recesses 131 may be formed by masking and etching the interlayer dielectric layer 130. The adhesive layer 1110a is thereby conformally formed along sidewalls and bottom surfaces of the recesses 131, as well as on the surface of the interlayer dielectric layer 130 between the recesses 131. Portions of the adhesive layer 1110a outside the recesses 131 are removed to expose the surface of the interlayer dielectric layer 130, such that the portions of the adhesive layer 1110a remaining in the recesses 131 define the adhesive layer pattern 1110' on the sidewalls and the bottom surface of the recesses 131. For example, the adhesive layer 1110a may be removed from the surface of the interlayer dielectric layer 130 using a CMP process. The reflective structures 1005 and interconnection structures 1001' are provided by forming and patterning a conductive layer 1120a and a capping layer 1130a in a manner similar to that described above with reference to FIGS. 3 and 4. However, due to the recesses 131 in interlayer dielectric layer 130, the interconnection structures 1001' (including the adhesive layer patterns 1110') extend into the recesses 131 along the sidewalls and the bottom surfaces thereof. Portions of the adhesive layer pattern 1110' on the sidewalls of the recess 131 are configured to reflect portions of the incident light toward the sensing regions 110. In particular, as shown in FIG. 27, due to differences in the reflectivity of the interconnection structure 1001' and the reflective structure 1005, oblique components of light that has passed through the light sensing region 110 and has been reflected by the reflected structure 1005 may be further reflected by portions of the adhesive layer pattern 1110' on the sidewall of the recess 131 and directed back to the light sensing region 110, as shown by the dotted line 1024.

FIG. 28 illustrates further embodiments where additional recesses 132 are formed in the interlayer dielectric layer 130 aligned with the light sensing regions 110. For example, after the recesses 131 are formed in interlayer dielectric layer and the adhesive layer pattern 1110' is formed in the recesses 131 as shown in FIG. 27, the additional recesses 132 may be formed in interlayer dielectric layer 130 by selectively masking and etching the interlayer dielectric layer 130. The recesses 132 are aligned with the light sensing regions 110. Accordingly, the recesses 131 are formed directly over the gate structures 120, while the recesses 132 are formed directly over the light sensing regions 110. The adhesive layer pattern 1110' is formed in the recesses 131, but is not formed in the recesses 132. The reflective structures 1005' and interconnection structures 1001' are provided by forming and patterning a conductive layer 1120a and a capping layer 1130a in a manner similar to that described above with reference to FIGS. 3 and 4. However, due to the recesses 131 in the interlayer dielectric layer 130, the interconnection structures 1001' extend into the recesses 131 along the sidewalls and the bottom surfaces thereof. Likewise, due to the recesses 132 in the interlayer dielectric layer 130, the reflective structures 1005' extend into the recesses 132, thereby reducing a distance between the reflective structures 1005' and the light sensing regions 110 as compared to that of the embodiment of FIG. 9.

Figure 29:
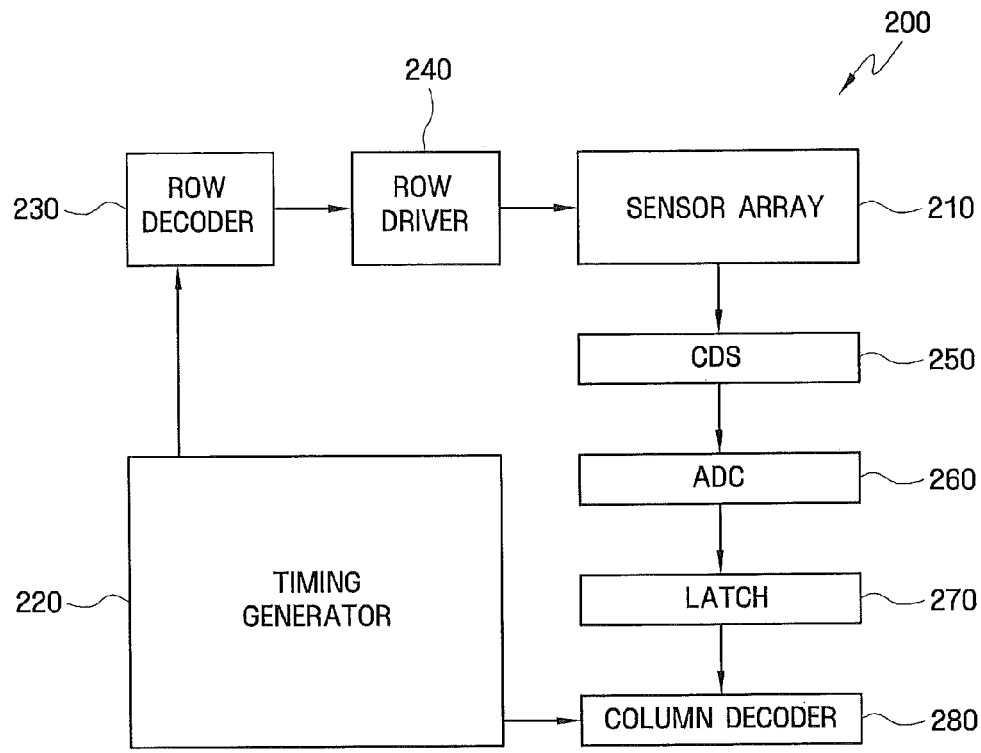
FIG. 29 is a block diagram illustrating an electronic system including image sensor devices according to some embodiments of the present inventive concept.

FIG. 29 is a block diagram illustrating an electronic system 200 including CMOS image sensor devices according to some embodiments of the present inventive concept. Referring now to FIG. 29, the system 200 includes a sensor array 210, a timing generator 220, a row decoder 230, a row driver 240, a correlated double sampler (CDS) 250, an analog to digital converter (ADC) 260, a latch 270, and a column decoder 280. The sensor array 210 includes at least one image sensor device as described above with reference to FIGS. 1-28, and is configured to provide an output signal in response to a driving signal from the row driver 240. In particular, the sensor array 210 includes a plurality of unit pixels arranged in two dimensions that are configured to convert an optical image into an electrical output signal. The sensor array 210 is configured to receive driving signals (such as a row selection signal, a reset signal, and/or a charge transfer signal) from the row driver 240 and provides the electrical output signal to the CDS 250. The timing generator 220 is configured to provide timing and control signals to the row decoder 230 and the column decoder 280. A row driver 240 is configured to generate driving signals for driving the unit pixels of the sensor array 210 according to the output provided by the row decoder 230. The CDS 250 holds and samples the electrical output signals received from the sensor array 210. The ADC 260 is configured to convert the analog signals from the CDS 250 into digital signals. The latch 270 is configured to latch the digital signals and output the latched signal to image signal handling components (not shown) according to the output provided by the column decoder 280. The blocks of the system 200 illustrated above may be provided using one chip or multiple chips. Also, such chips may be provided in a packaged form.

Figure 30:
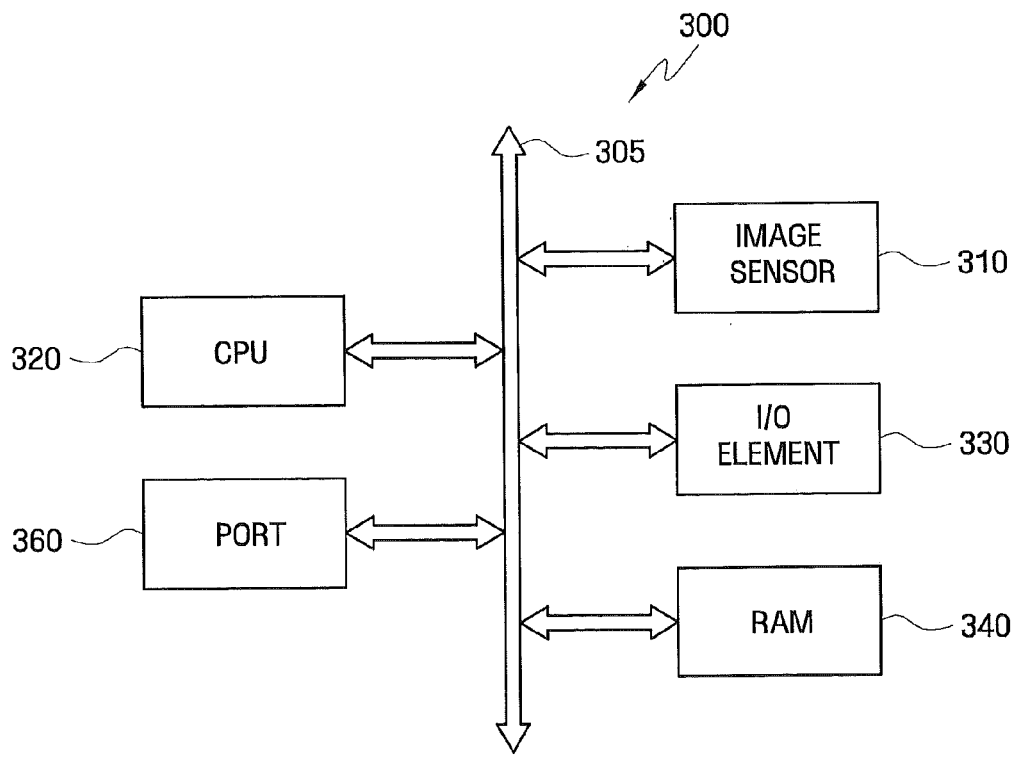
FIG. 30 is a block diagram illustrating a computer apparatus including image sensor devices according to some embodiments of the present inventive concept.

FIG. 30 illustrates a computer apparatus 300 including CMOS image sensor devices according to some embodiments of the present inventive concept. Referring now to FIG. 30, the computer apparatus 300 includes a central processing unit (CPU) 320 (such as a microprocessor), input/output (I/O) elements 330, a memory element 340 (such as a random access memory (RAM)), an image sensor 310, and a bus configured to communicatively couple the CPU 320, the I/O element 330, the memory element 340, and the image sensor 310. The computer apparatus 300 further includes one or more ports 360 configured to communicate with the CPU 320 via the bus 305. The port 360 may be configured to provide communication with a video card, a sound card, a memory card, a USB device, and/or other external devices. The image sensor 310 includes at least one image sensor device as described above. In some embodiments, the image sensor 310 may be integrated with a CPU, a digital signal processor (DSP), a microprocessor, and/or a memory device.

Figure 31:
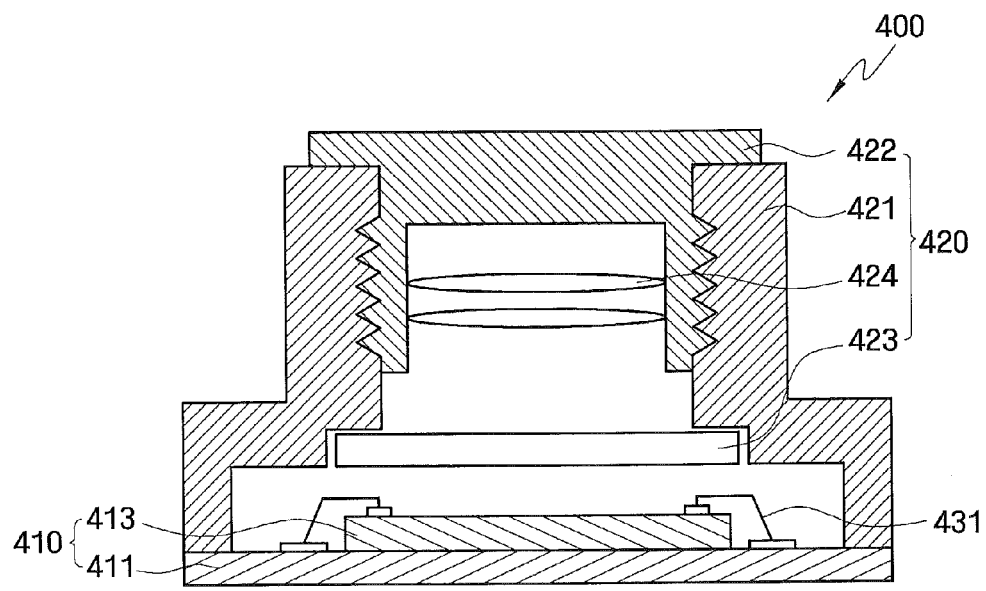
FIG. 31 is a cross-sectional view illustrating a camera apparatus including image sensor devices according to some embodiments of the present inventive concept.

FIG. 31 illustrates a camera apparatus 400 including CMOS image sensor devices according to some embodiments of the present inventive concept. Referring now to FIG. 31, the camera apparatus 400 includes a CMOS Image Sensor (CIS) package 410 within a housing 420. The CIS package 410 includes an image sensor chip 413 on a substrate 411. In FIG. 31, the image sensor chip 413 is connected to the substrate by a bonding wire 431. The housing 420 is also attached to the substrate 411 and is configured to protect the substrate 411 and the image sensor chip 413. The housing 420 includes a cylindrical aperture 421 configured to receive incident light, a protective cover 422, a filter 423 (which may be configured to absorb infrared light and/or prevent reflection), and at least one lens 424 configured to direct the incident light towards the image sensor chip 413. The image sensor chip 413 includes at least one image sensor device as discussed above with reference to FIGS. 1-28.

Figure 32:
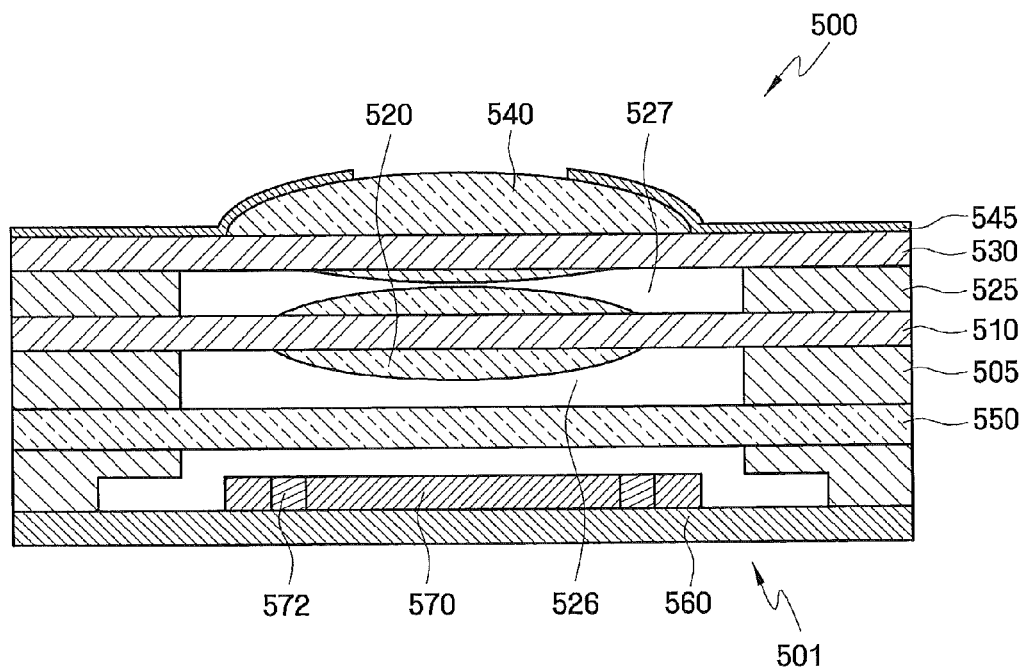
FIG. 32 is a cross-sectional view illustrating a camera apparatus including image sensor devices according to further embodiments of the present inventive concept.

FIG. 32 illustrates a camera apparatus 500 including CMOS image sensor devices according to further embodiments of the present inventive concept. Referring now to FIG. 32, the camera apparatus 500 includes an image sensor package 501 including a printed circuit board (PCB) substrate 560 and an image sensor chip 570 on the substrate 560. The image sensor chip 570 includes a conductive via structure (also referred to as a through via electrode) 572 extending therethrough to electrically couple the image sensor chip 572 to the substrate 560. The camera apparatus 500 further includes a lens component 526 and a first lens 520 thereon, a lens component 527, a second lens 540, transparent substrates 510, 530, and 550, support members 505 and 525, and an aperture 545 configured to receive incident light. The lenses 520 and 540 are configured to direct the incident light towards the image sensor chip 570. One or more of the transparent substrates 510, 530, and 550 may be a glass substrate in some embodiments.

Figure 33:
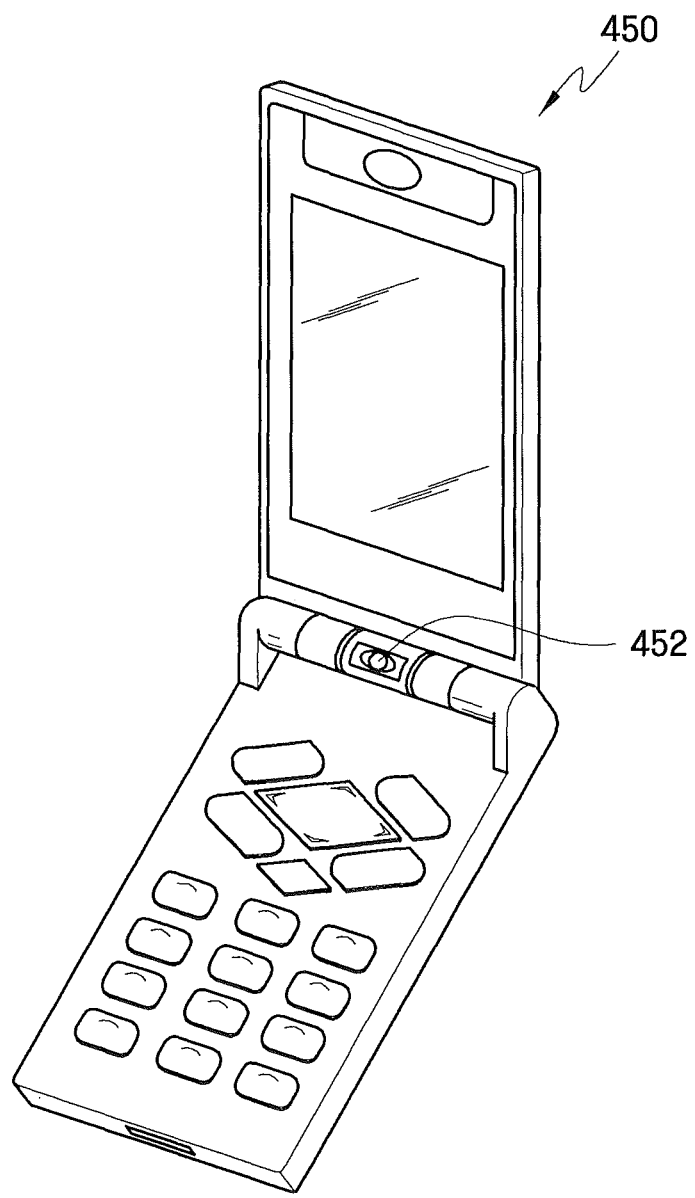
FIG. 33 illustrates a mobile terminal including image sensor device according to some embodiments of the present inventive concept.

FIG. 33 illustrates a mobile terminal 450, such as a cellular telephone, including an image sensor device 452 according to some embodiments of the present inventive concept. The image sensor device 452 may be included in a camera apparatus of the mobile terminal 450.

As described above, embodiments according to the present inventive concept provide image sensor devices including a reflective structure arranged over (or under) and aligned with a light sensing device, such as a photodiode. The reflective structure is configured to reflect portions of the incident light that pass through the light sensing region back toward the light sensing region. An interconnection structure is provided adjacent to the reflective structure. The interconnection structure is configured to conduct electrical signals, and includes an adhesive pattern that is configured to lower a reflectivity thereof as compared to the reflective structure. Embodiments of the present inventive concept provide improved light outflow, especially for light having wavelengths of greater than about 500 nm, as compared to devices without such an adhesive pattern.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

That which is claimed:

1. An image sensor device comprising:
   a semiconductor layer including a light sensing region therein;
   an interlayer dielectric layer on the semiconductor layer, wherein the interlayer dielectric layer defines a planar surface opposite the semiconductor layer;
   an electrically conductive reflector on the planar surface of the interlayer dielectric layer so that the interlayer dielectric layer is between the electrically conductive reflector and the light sensing region of the semiconductor layer; and
   an electrically conductive interconnection structure spaced apart from the electrically conductive reflector on the planar surface of the interlayer dielectric layer so that the interlayer dielectric layer is between the semiconductor layer and the electrically conductive interconnection structure and so that an interface between the electrically conductive interconnection structure and the interlayer dielectric layer is coplanar with an interface between the electrically conductive reflector and the interlayer dielectric layer.

2. The image sensor device of claim 1 wherein each of the electrically conductive reflector and the electrically conductive interconnection structure comprises a layer of a conduction material and a layer of a capping material on the layer of the conduction material, and wherein the conduction and capping materials are different.

3. The image sensor device of claim 2 wherein the conduction material comprises aluminum and/or copper.

4. The image sensor device of claim 2 wherein the conduction material comprises aluminum and wherein the capping material comprises titanium and/or titanium nitride.

5. The image sensor device of claim 1 wherein the electrically conductive reflector and the electrically conductive interconnection structure have a same thickness.

6. The image sensor device of claim 1 wherein portions of the electrically conductive reflector are aligned with portions of the light sensing region in a direction normal to a surface of the semiconductor layer.

7. The image sensor device of claim 6 further comprising:
a red color filter on the semiconductor layer so that the light sensing region is between the red color filter and the electrically conductive reflector, and wherein portions of the red color filter are aligned with the light sensing region and with the electrically conductive reflector in the direction normal to the surface of the semiconductor layer.

8. The image sensor device of claim 7 further comprising:
a lens on the semiconductor layer so that the light sensing region is between the lens and the electrically conductive reflector, wherein the lens, the color filter, the light sensing region, and the electrically conductive reflector are aligned in the direction normal to the surface of the semiconductor layer.

9. The image sensor device of claim 1 wherein an interface between the electrically conductive reflector and the interlayer dielectric layer is more reflective than an interface between the interlayer dielectric layer and the electrically conductive interconnection structure.

10. The image sensor device of claim 1 further comprising:
first and second gate structures on the semiconductor layer, wherein the first and second gate structures are offset relative to the light sensing region, wherein the first and second gate structures are between the semiconductor layer and the interlayer dielectric layer.

11. The image sensor device of claim 1 wherein the interlayer dielectric layer comprises a first interlayer dielectric layer and the electrically conductive interconnection structure comprises a first electrically conductive interconnection structure, the image sensor device further comprising:
a second interlayer dielectric layer on the electrically conductive reflector and on the first interlayer dielectric layer so that the electrically conductive reflector is between the first and second interlayer dielectric layers; and
second and third electrically conductive interconnection structures spaced apart on the second interlayer dielectric layer so that the second interlayer dielectric layer is between the electrically conductive reflector and each of the second and third electrically conductive interconnection structures, and wherein portions of each of the second and third electrically conductive interconnection structures are aligned with portions of the electrically conductive reflector in a direction normal to a surface of the semiconductor layer.

12. An image sensor device comprising:
a semiconductor layer including a light sensing region therein;
a first interlayer dielectric layer on the semiconductor layer;
an electrically conductive reflector on the first interlayer dielectric layer so that the first interlayer dielectric layer is between the electrically conductive reflector and the light sensing region of the semiconductor layer;
a second interlayer dielectric layer on the electrically conductive reflector and on the first interlayer dielectric layer so that the electrically conductive reflector is between the first and second interlayer dielectric layers; and
first and second electrically conductive interconnection structures spaced apart on the second interlayer dielectric layer so that the second interlayer dielectric layer is between the electrically conductive reflector and each of the first and second electrically conductive interconnection structures, wherein portions of each of the first and second electrically conductive interconnection structures are aligned with portions of the electrically conductive reflector in a direction normal to a surface of the semiconductor layer.

13. The image sensor device of claim 12 wherein widths of each of the first and second electrically conductive interconnection structures are less than a width of the electrically conductive reflector.

14. The image sensor device of claim 12 further comprising:
a third electrically conductive interconnection structure spaced apart from the electrically conductive reflector on the first interlayer dielectric layer so that the third electrically conductive interconnection structure is between the first and second interlayer dielectric layers.

15. The image sensor device of claim 14 wherein each of the electrically conductive reflector and the third electrically conductive interconnection structure comprises a layer of a conduction material and a layer of a capping material on the layer of the conduction material, and wherein the conduction and capping materials are different.

16. The image sensor device of claim 14 wherein the conduction material comprises aluminum and/or copper.

17. The image sensor device of claim 14 wherein the conduction material comprises aluminum and wherein the capping material comprises titanium and/or titanium nitride.

18. The image sensor device of claim 14 wherein the electrically conductive reflector and the third electrically conductive interconnection structure have a same thickness.

19. The image sensor device of claim 14 wherein an interface between the electrically conductive reflector and the first interlayer dielectric layer is more reflective than an interface between the first interlayer dielectric layer and the third electrically conductive interconnection structure.

20. The image sensor device of claim 12 wherein portions of the electrically conductive reflector are aligned with portions of the light sensing region in a direction normal to a surface of the semiconductor layer.

21. The image sensor device of claim 20 further comprising:
a red color filter on the semiconductor layer so that the light sensing region is between the red color filter and the electrically conductive reflector, and wherein portions of the red color filter are aligned with the light sensing region and with the electrically conductive reflector in the direction normal to the surface of the semiconductor layer.

22. The image sensor device of claim 21 further comprising:
- a lens on the semiconductor layer so that the light sensing region is between the lens and the electrically conductive reflector, wherein the lens, the color filter, the light sensing region, and the electrically conductive reflector are aligned in the direction normal to the surface of the semiconductor layer.

23. The image sensor device of claim 12 further comprising:
- first and second gate structures on the semiconductor layer, wherein the first and second gate structures are offset relative to the light sensing region, wherein the first and second gate structures are between the semiconductor layer and the first interlayer dielectric layer.

* * * * *